(12) United States Patent
Lee et al.

(10) Patent No.: US 12,393,307 B2
(45) Date of Patent: Aug. 19, 2025

(54) TOUCH DISPLAY DEVICE AND TOUCH SENSING METHOD

(71) Applicant: LG Display Co., Ltd., Seoul (KR)

(72) Inventors: HwiDeuk Lee, Gumi-si (KR); Beom-Jin Kim, Seoul (KR); HyeongWon Kang, Seoul (KR); JuHong Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/505,415

(22) Filed: Nov. 9, 2023

(65) Prior Publication Data

US 2024/0160318 A1 May 16, 2024

(30) Foreign Application Priority Data

Nov. 10, 2022 (KR) .......................... 10-2022-0149937

(51) Int. Cl.
G09G 3/20 (2006.01)
G06F 3/041 (2006.01)
G06F 3/044 (2006.01)
H10K 59/40 (2023.01)
G09G 3/3258 (2016.01)

(52) U.S. Cl.
CPC ........ G06F 3/04184 (2019.05); G06F 3/0412 (2013.01); G06F 3/0418 (2013.01); G06F 3/0446 (2019.05); G09G 3/2074 (2013.01); H10K 59/40 (2023.02); G06F 2203/04111 (2013.01); G09G 3/3258 (2013.01); G09G 2300/0842 (2013.01); G09G 2310/08 (2013.01); G09G 2354/00 (2013.01)

(58) Field of Classification Search
CPC .. G06F 3/0412; G06F 3/04164; G06F 3/0418; G06F 3/04184; G06F 3/0443; G06F 3/0446; G06F 3/046; G06F 2203/04111; G09G 3/2074; G09G 3/3233; G09G 3/3258; G09G 2300/0842; G09G 2310/08; G09G 2354/00; H10K 59/40
See application file for complete search history.

(56) References Cited

U.S. PATENT DOCUMENTS

2023/0200180 A1* 6/2023 Park ..................... H10K 59/351 345/173
2023/0200181 A1* 6/2023 Park ..................... H01L 27/124 345/173

FOREIGN PATENT DOCUMENTS

TW I627570 B * 6/2018

* cited by examiner

Primary Examiner — Julie Anne Watko
(74) Attorney, Agent, or Firm — Fenwick & West LLP

(57) ABSTRACT

Embodiments of the disclosure relate to a touch display device and a touch sensing method and may specifically include a first pixel area, a first touch sensor area positioned on one side of the first pixel area, a first subpixel disposed in the first pixel area and including a light emitting element and a scanning transistor, a first display driving line connected to the first subpixel, a first touch sensor disposed in the first touch sensor area, a first sensing line disposed adjacent to the first touch sensor, a first touch line electrically connected to the first touch sensor, and a first sensing transistor controlling an electrical connection between the first sensing line and the first touch sensor, thereby removing a ghost touch that may occur due to temperature influence.

25 Claims, 32 Drawing Sheets

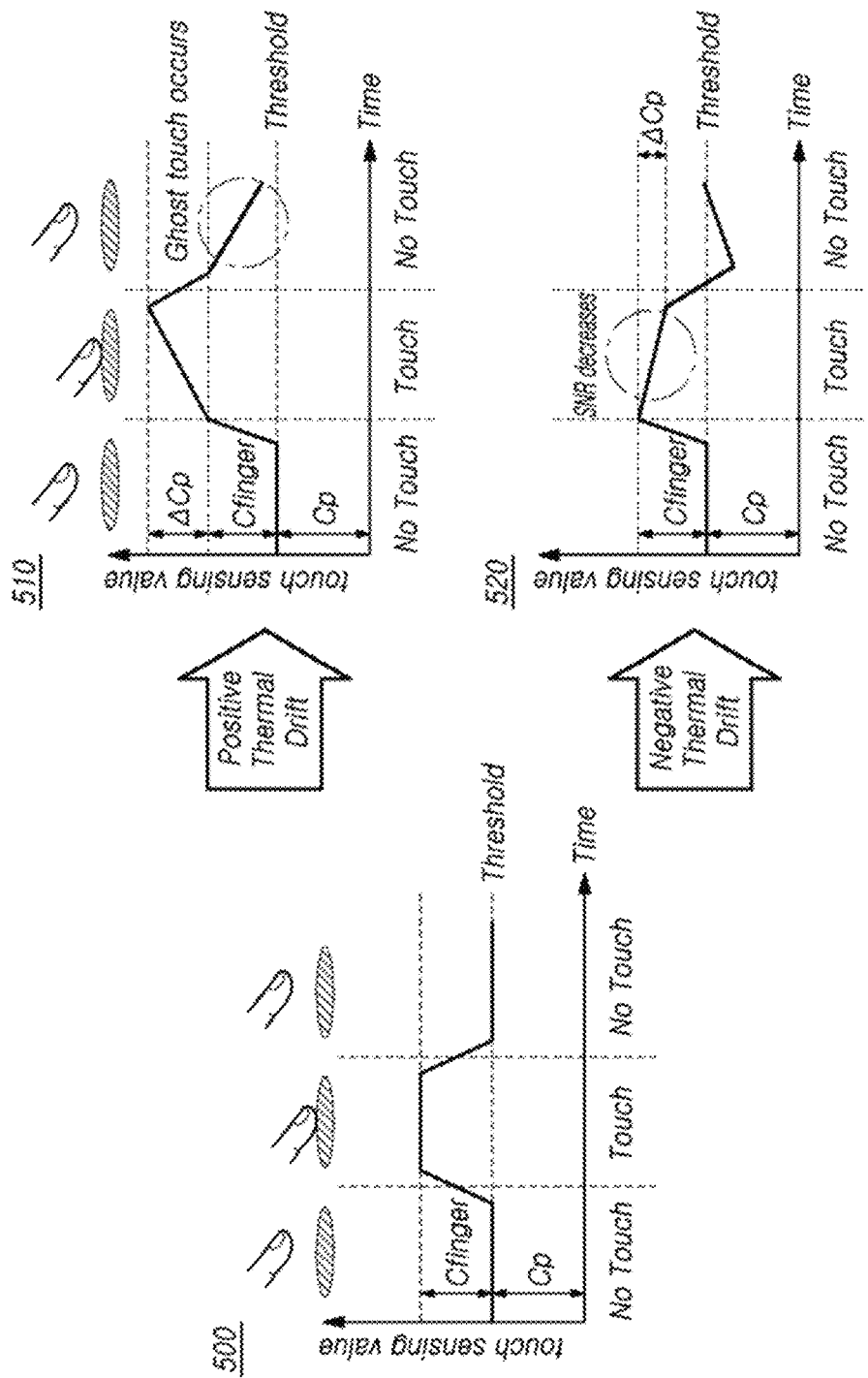

TOUCH DISPLAY DEVICE AND TOUCH SENSING METHOD

CROSS-REFERENCE TO RELATED APPLICATION

This application claims priority and benefits from Republic of Korea Patent Application No. 10-2022-0149937, filed on Nov. 10, 2022, which is hereby incorporated by reference in its entirety.

BACKGROUND

Field

Embodiments of the disclosure relate to a touch display device and a touch sensing method.

Description of Related Art

Among others, touch display devices provide an input scheme that allows users easier and more intuitive and convenient entry of information or commands without the need for buttons, a keyboard, a mouse, or other typical input means.

The description provided in the background section should not be assumed to be prior art merely because it is mentioned in or associated with the background section. The background section may include information that describes one or more aspects of the subject technology.

SUMMARY

In the self-luminous display, when a touch sensor is embedded in the display panel, parasitic capacitance due to surrounding electrical patterns, such as display-related electrodes or lines present in the display panel, increases, resulting in deterioration of touch sensitivity. Further, parasitic capacitance may change due to an unknown cause, deteriorating touch sensitivity.

In the field of display technology and touch technology, despite the development of various technologies for enhancing touch sensitivity, deterioration of touch sensitivity due to an unknown cause occurs.

Accordingly, the inventors of the disclosure have discovered, through long-term experiments and analysis, recognition of an unrealistic ghost touch even after a touch by a touch pointer, such as a finger, is terminated.

Further, the inventors of the disclosure also found out, through long-term experiments and analysis, recognition of an unrealistic ghost touch when an image is changed.

The inventors of the disclosure have figured out, through long-term experiments and analysis, that a change in parasitic capacitance occurs in a touch sensor due to the characteristics of organic materials in the display panel, causing a ghost touch when a finger touch is made or an image is changed.

Accordingly, embodiments of the disclosure may provide a touch display device and a touch sensing method capable of removing a ghost touch.

Embodiments of the disclosure may provide a touch display device and a touch sensing method that prevent a ghost touch from being recognized after a finger touch occurs.

Embodiments of the disclosure may provide a touch display device and a touch sensing method that prevent a ghost touch from being recognized when an image is changed.

Embodiments of the disclosure may provide a touch display device and a touch sensing method having a temperature sensor structure combined with a touch sensor structure.

Embodiments of the disclosure may provide a touch display device and a touch sensing method capable of compensating for a touch sensing value by sensing a current reflecting temperature.

A touch display device according to embodiments of the disclosure may comprise a first pixel area, a first touch sensor area positioned on one side of the first pixel area, a first subpixel disposed in the first pixel area and including a light emitting element and a scanning transistor, a first display driving line connected to the first subpixel, a first touch sensor disposed in the first touch sensor area, and a first touch line electrically connected to the first touch sensor.

The touch display device according to embodiments of the disclosure may further comprise a first sensing line disposed adjacent to the first touch sensor and a first sensing transistor controlling an electrical connection between the first sensing line and the first touch sensor.

The touch display device according to embodiments of the disclosure may further comprise a first scanning gate line simultaneously supplying a first scanning gate signal for simultaneously controlling on/off of the scanning transistor and the first sensing transistor to the scanning transistor and the first sensing transistor.

In the touch display device according to embodiments of the disclosure, the first touch sensor area may be a transmissive area capable of transmitting light.

In the touch display device according to embodiments of the disclosure, the first display driving line may be electrically connected to a second electrode of a first electrode and the second electrode of the light emitting element.

The touch display device according to embodiments of the disclosure may further comprise a display common electrode disposed in the first pixel area and connected to the first display driving line.

In the touch display device according to embodiments of the disclosure, the first touch sensor disposed in the first touch sensor area may include the same material as the display common electrode.

The touch display device according to embodiments of the disclosure may further comprise a sensing resistor connected between the first touch line and the first touch sensor.

In the touch display device according to embodiments of the disclosure, during the display period, the first touch sensor and the first sensing line may be electrically connected, a test signal is supplied to the first touch line, and a current may flow through the first sensing line.

In the touch display device according to embodiments of the disclosure, during the display period, as the amount of the current flowing through the first sensing line per unit time changes, a touch sensing value obtained during the touch period after the display period may be changed.

In the touch display device according to embodiments of the disclosure, during the display period, the first touch sensor and the first sensing line are electrically connected, a test signal may be supplied to the first sensing line, and a current may flow through the first touch line.

In the touch display device according to embodiments of the disclosure, during the display period, as the amount of the current flowing through the first touch line per unit time changes, a touch sensing value obtained during the touch period after the display period may be changed.

A touch sensing method according to embodiments of the disclosure may comprise obtaining a temperature sensing value by sensing a temperature of an area of a touch sensor or obtaining a current sensing value as the temperature sensing value by sensing a current through the touch sensor, obtaining a first touch sensing value through the touch sensor during a touch period, generating a second touch sensing value by changing the first touch sensing value based on the temperature sensing value, and determining whether a touch is made or a touch position based on the second touch sensing value.

In the touch sensing method according to embodiments of the disclosure, as the temperature increases, an amount of the current flowing through the touch sensor per unit time may increase.

In the touch sensing method according to embodiments of the disclosure, a data voltage for displaying an image may be supplied to a subpixel adjacent to the touch sensor while obtaining the temperature sensing value proceeds.

In the touch sensing method according to embodiments of the disclosure, a difference between the first touch sensing value and the second touch sensing value may increase as the temperature sensing value increases.

A touch display device according to embodiments of the disclosure may comprise a first touch sensor disposed in a first touch sensor area, a first sensing line disposed adjacent to the first touch sensor, a first touch line electrically connected to the first touch sensor, and a first sensing transistor controlling an electrical connection between the first sensing line and the first touch sensor.

The touch display device according to embodiments of the disclosure may further comprise a subpixel disposed in a first pixel area disposed adjacent to the first touch sensor area. The subpixel may include a light emitting element and a scanning transistor.

In the touch sensing method according to embodiments of the disclosure, a data voltage for displaying an image may be supplied to the subpixel during a period when the first sensing transistor is turned on.

In the touch display device according to embodiments of the disclosure, a test signal may be supplied to the first touch line during a period when the first sensing transistor is turned on. In this case, the touch display device according to embodiments of the disclosure may further comprise a current sensing circuit for sensing a current flowing through the first sensing line during the period when the first sensing transistor is turned on.

In the touch display device according to embodiments, a test signal may be supplied to the first sensing line during a period when the first sensing transistor is turned on. In this case, the touch display device according to embodiments of the disclosure may further comprise a touch driving circuit for sensing a current flowing through the first touch line during the period when the first sensing transistor is turned on.

According to embodiments of the disclosure, there may be provided a touch display device and a touch sensing method capable of removing a ghost touch.

According to embodiments of the disclosure, there may be provided a touch display device and a touch sensing method that prevent a ghost touch from being recognized after a finger touch occurs.

According to embodiments of the disclosure, there may be provided a touch display device and a touch sensing method that prevent a ghost touch from being recognized when an image is changed.

According to embodiments of the disclosure, there may be provided a touch display device and a touch sensing method having a temperature sensor structure combined with a touch sensor structure.

According to embodiments of the disclosure, there may be provided a touch display device and a touch sensing method capable of compensating for a touch sensing value by sensing a current reflecting temperature.

According to embodiments of the disclosure, there may be provided a transparent display capable of touch sensing.

According to embodiments of the disclosure, as the touch sensor is embedded in the display panel, and a temperature sensor structure is designed using the touch sensor structure embedded in the display panel, it is possible to reduce the weight of the touch display device as compared with when a touch panel is provided outside the display panel or when a temperature sensor is separately provided.

According to embodiments of the disclosure, as the touch sensor is embedded in the display panel, and a temperature sensor structure is designed using the touch sensor structure embedded in the display panel, it is possible to simplify or omit several processes to help process optimization.

According to embodiments of the disclosure, as temperature sensing is possible during display driving, low-power and high-efficiency driving is possible.

It is to be understood that both the foregoing general description and the following detailed description are exemplary and explanatory and are intended to provide further explanation of the inventive concepts as claimed.

DESCRIPTION OF DRAWINGS

The accompanying drawings, which are included to provide a further understanding of the disclosure and are incorporated in and constitute a part of this application, illustrate embodiments of the disclosure and together with the description serve to explain the principle of the disclosure. The above and other objects, features, and advantages of the disclosure will be more clearly understood from the following detailed description, taken in conjunction with the accompanying drawings, in which:

FIG. 5 is a view illustrating a change in touch sensitivity when a thermal drift occurs due to a touch pointer in a touch display device according to exemplary embodiments of the disclosure;

Figure 1:
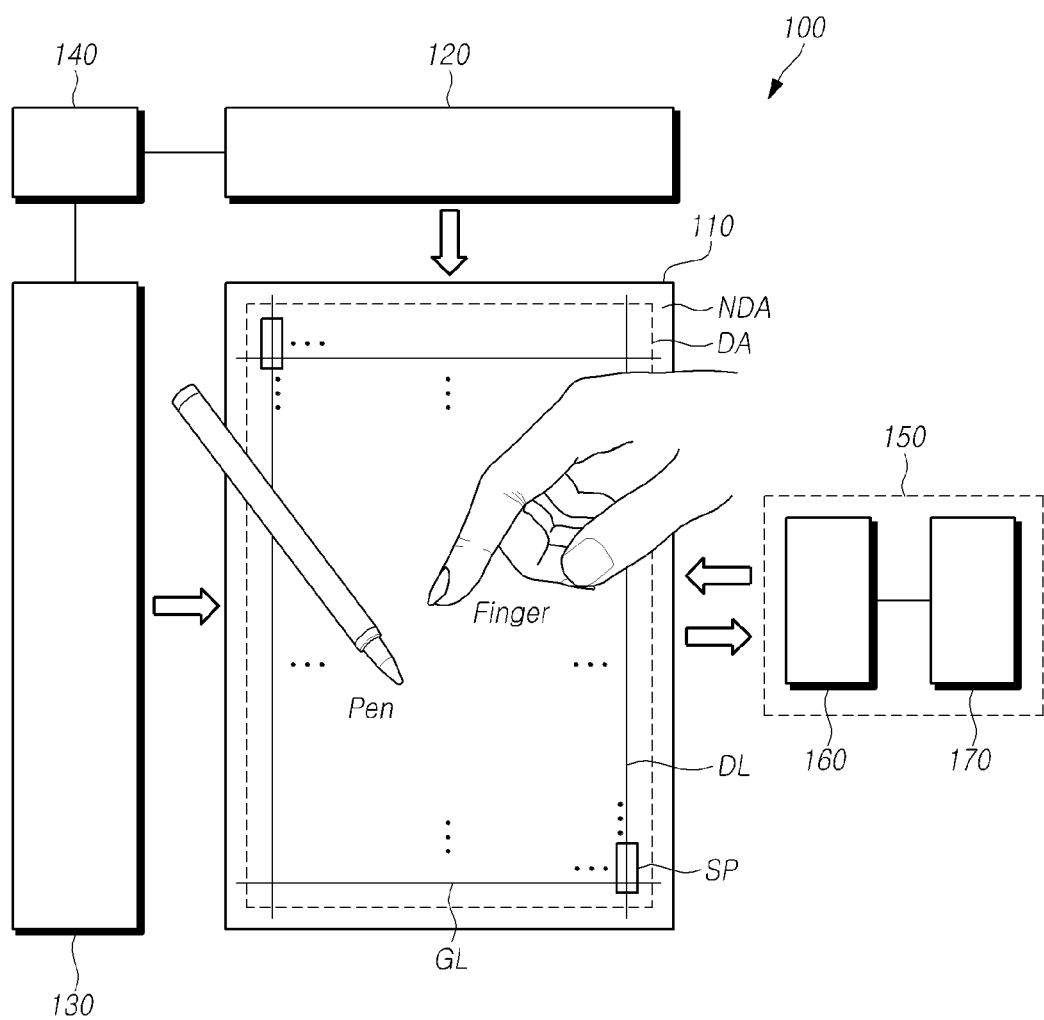
FIG. 1 is a view illustrating a system configuration of a touch display device according to exemplary embodiments of the disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Advantages and features of the present disclosure, and implementation methods thereof will be clarified through following example embodiments described with reference to the accompanying drawings. The present disclosure may, however, be embodied in different forms and should not be construed as limited to example embodiments set forth herein. Rather, these example embodiments may be provided so that this disclosure may be sufficiently thorough and complete to assist those skilled in the art to fully understand the scope of the present disclosure. Further, the present disclosure is only defined by scopes of claims.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements. Any implementation described herein as an "example" is not necessarily to be construed as preferred or advantageous over other implementations.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

The terms, such as "below," "lower," "above," "upper" and the like, may be used herein to describe a relationship between element item(s) as illustrated in the drawings. It will be understood that the terms are spatially relative and based on the orientation depicted in the drawings. The term "at least one" should be understood as including any and all combinations of one or more of the associated listed items. For example, the meaning of "at least one of a first element, a second element, and a third element" compasses the combination of all three listed elements, combinations of any two of the three elements, as well as each individual element, the first element, the second element, or the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, various embodiments of the disclosure are described in detail with reference to the accompanying drawings.

FIG. 1 is a view illustrating a system configuration of a touch display device 100 according to exemplary embodiments of the disclosure.

Referring to FIG. 1, a touch display device 100 may include a display panel 110 and display driving circuits, as components for displaying images.

The display driving circuits are circuits for driving the display panel 110 and may include a data driving circuit 120, a gate driving circuit 130, and a display controller 140, etc.

The display panel 110 may include a display area DA in which images are displayed and a non-display area NDA in which no image is displayed. As an example, the non-display area NDA may be adjacent to the display area DA. As an example, the non-display area NDA may be an outer area of the display area DA and be referred to as a bezel area. As an example, the non-display area NDA may at least partially surround the display area DA. The whole or part of the non-display area NDA may be an area visible from the front surface of the touch display device 100 or an area that is bent and not visible from the front surface of the touch display device 100.

The display panel 110 may include a plurality of subpixels SP. The display panel 110 may further include various types of signal lines to drive the plurality of subpixels SP.

The touch display device 100 according to exemplary embodiments of the disclosure may be a liquid crystal display device or a self-emission display device in which the display panel 110 emits light by itself. When the touch display device 100 according to the embodiments of the disclosure is a self-emission display device, each of the plurality of subpixels SP may include a light emitting element.

For example, the touch display device 100 according to embodiments of the disclosure may be an organic light emitting diode display in which the light emitting element is implemented as an organic light emitting diode (OLED). As another example, the touch display device 100 according to embodiments of the disclosure may be an inorganic light emitting display device in which the light emitting element is implemented as an inorganic material-based light emitting diode. As another example, the touch display device 100 according to embodiments of the disclosure may be a quantum dot display device in which the light emitting element is implemented as a quantum dot which is self-emission semiconductor crystal.

The structure of each of the plurality of subpixels SP may vary according to the type of the touch display device 100. For example, when the touch display device 100 is a self-emission display device in which the subpixels SP emit light by themselves, each subpixel SP may include a light emitting element that emits light by itself, one or more transistors, and one or more capacitors, without being limited thereto.

For example, various types of signal lines may include a plurality of data lines DL transferring data signals (also referred to as data voltages or image signals) and a plurality of gate lines GL transferring gate signals (also referred to as scanning signals).

The plurality of data lines DL and the plurality of gate lines GL may cross each other. Each of the plurality of data lines DL may be disposed while extending in a first direction. Each of the plurality of gate lines GL may be disposed while extending in a second direction. As an example, the first direction may intersect with or be orthogonal to the second direction.

Here, the first direction may be a column direction and the second direction may be a row direction. Alternatively, the first direction may be the row direction, and the second direction may be the column direction.

The data driving circuit 120 is a circuit for driving the plurality of data lines DL, and may output data signals to the plurality of data lines DL. The gate driving circuit 130 is a circuit for driving the plurality of gate lines GL, and may output gate signals to the plurality of gate lines GL. The display controller 140 is a device for controlling the data driving circuit 120 and the gate driving circuit 130 and may control driving timings for the plurality of data lines DL and driving timings for the plurality of gate lines GL.

The display controller 140 may supply a data driving control signal to the data driving circuit 120 to control the data driving circuit 120 and may supply a gate driving control signal to the gate driving circuit 130 to control the gate driving circuit 130.

The data driving circuit 120 may supply data signals to the plurality of data lines DL according to the driving timing control of the display controller 140. The data driving circuit 120 may receive digital image data from, for example, the display controller 140 and may convert the received image data into analog data signals and output them to the plurality of data lines DL.

The gate driving circuit 130 may supply gate signals to the plurality of gate lines GL according to the timing control of the display controller 140. The gate driving circuit 130 may receive a first gate voltage corresponding to a turn-on level voltage and a second gate voltage corresponding to a turn-off level voltage, along with various gate driving control signals (e.g., start signal and/or reset signal), generate gate signals, and supply the generated gate signals to the plurality of gate lines GL.

For example, the data driving circuit 120 may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate or may be connected to the substrate. In other words, the gate driving circuit 130 that is of a GIP type may be disposed in the non-display area NDA of the substrate. The gate driving circuit 130 that is of a chip-on-glass (COG) type or chip-on-film (COF) type may be connected to the substrate.

Meanwhile, at least one of the data driving circuit 120 and the gate driving circuit 130 may be disposed in the display area DA of the display panel 110. For example, at least one of the data driving circuit 120 and the gate driving circuit 130 may be disposed not to overlap the subpixels SP or to overlap all or some of the subpixels SP.

The data driving circuit 120 may be connected to one side (e.g., an upper or lower side, without being limited thereto) of the display panel 110. Depending on the driving scheme or the panel design scheme, data driving circuits 120 may be connected with both the sides (e.g., both the upper and lower sides, without being limited thereto) of the display panel 110, or two or more of the four sides of the display panel 110.

The gate driving circuit 130 may be connected to one side (e.g., a left or right side, without being limited thereto) of the display panel 110. Depending on the driving scheme or the panel design scheme, gate driving circuits 130 may be connected with both the sides (e.g., both the left and right sides, without being limited thereto) of the display panel 110, or two or more of the four sides of the display panel 110.

The display controller 140 may be implemented as a separate component from the data driving circuit 120, or the display controller 140 and the data driving circuit 120 may be integrated into an integrated circuit (IC).

The display controller 140 may be a timing controller used in typical display technology, a control device that may perform other control functions as well as the functions of the timing controller, or a control device other than the timing controller, or may be a circuit in the control device. The display controller 140 may be implemented as various circuits or electronic components, such as an integrated circuit (IC), a field programmable gate array (FPGA), an application specific integrated circuit (ASIC), or a processor.

The display controller 140 may be mounted on a printed circuit board or a flexible printed circuit and may be electrically connected with the data driving circuit 120 and the gate driving circuit 130 through the printed circuit board or the flexible printed circuit.

The display controller 140 may transmit/receive signals to/from the data driving circuit 120 according to one or more predetermined interfaces. The interface may include, e.g., a low voltage differential signaling (LVDS) interface, an embedded clock point-point interface (EPI), and a serial peripheral interface (SPI).

To provide a touch sensing function as well as an image display function, the touch display device 100 according to exemplary embodiments of the disclosure may include a touch panel and a touch sensing circuit 150 that senses the touch panel to detect whether a touch occurs by a touch object, such as a finger or pen, or the position of the touch.

The touch sensing circuit 150 may include a touch driving circuit 160 that drives and senses the touch panel and generates and outputs touch sensing data and a touch controller 170 that may detect an occurrence of a touch or the position of the touch using touch sensing data.

The touch panel may include a plurality of touch electrodes as touch sensors. The touch panel may further include a plurality of touch lines for electrically connecting the plurality of touch electrodes and the touch driving circuit 160. The touch panel or touch electrode is also referred to as a touch sensor.

The touch panel may exist outside or inside the display panel 110. When the touch panel exists outside the display panel 110, the touch panel is referred to as an external type. When the touch panel is of the external type, the touch panel and the display panel 110 may be separately manufactured and/or may be combined during an assembly process. The external-type touch panel may include a substrate and a plurality of touch electrodes on the substrate. When the touch panel exists inside the display panel 110, the touch panel is referred to as an internal type. When the touch panel is of the internal type, the touch panel may be formed in the display panel 110 during a manufacturing process of the display panel 110.

The touch driving circuit 160 may supply a touch driving signal to at least one of the plurality of touch electrodes and may sense at least one of the plurality of touch electrodes to generate touch sensing data.

The touch sensing circuit 150 may perform touch sensing in a self-capacitance sensing scheme or a mutual-capacitance sensing scheme.

When the touch sensing circuit 150 performs touch sensing in the self-capacitance sensing scheme, the touch sensing circuit 150 may perform touch sensing based on capacitance between at least one touch electrode and the touch object (e.g., finger or pen).

According to the self-capacitance sensing scheme, each of the plurality of touch electrodes may serve both as a driving touch electrode and as a sensing touch electrode. The touch driving circuit 160 may drive all or some of the plurality of touch electrodes and sense all or some of the plurality of touch electrodes.

When the touch sensing circuit 150 performs touch sensing in the mutual-capacitance sensing scheme, the touch sensing circuit 150 may perform touch sensing based on capacitance between the touch electrodes.

According to the mutual-capacitance sensing scheme, the plurality of touch electrodes are divided into driving touch electrodes and sensing touch electrodes. The touch driving circuit 160 may drive the driving touch electrodes and sense the sensing touch electrodes.

As described above, the touch sensing circuit 150 may perform touch sensing in a self-capacitance sensing scheme and/or a mutual-capacitance sensing scheme. However, for convenience of description, it is assumed below that the touch sensing circuit 150 performs touch sensing using a self-capacitance sensing scheme.

The touch driving circuit 160 and the touch controller 170 included in the touch sensing circuit 150 may be implemented as separate devices or as a single device.

The touch driving circuit 160 and the data driving circuit 120 may be implemented as separate devices or as a single device.

The touch display device 100 may further include a power supply circuit for supplying various types of power to the display driver integrated circuit and/or the touch sensing circuit 150.

The touch display device 100 according to exemplary embodiments of the disclosure may be a mobile terminal, such as a smart phone or a tablet, or a monitor or television (TV) in various sizes but, without limited thereto, may be a display in various types and various sizes capable of displaying information or images.

Figure 2:
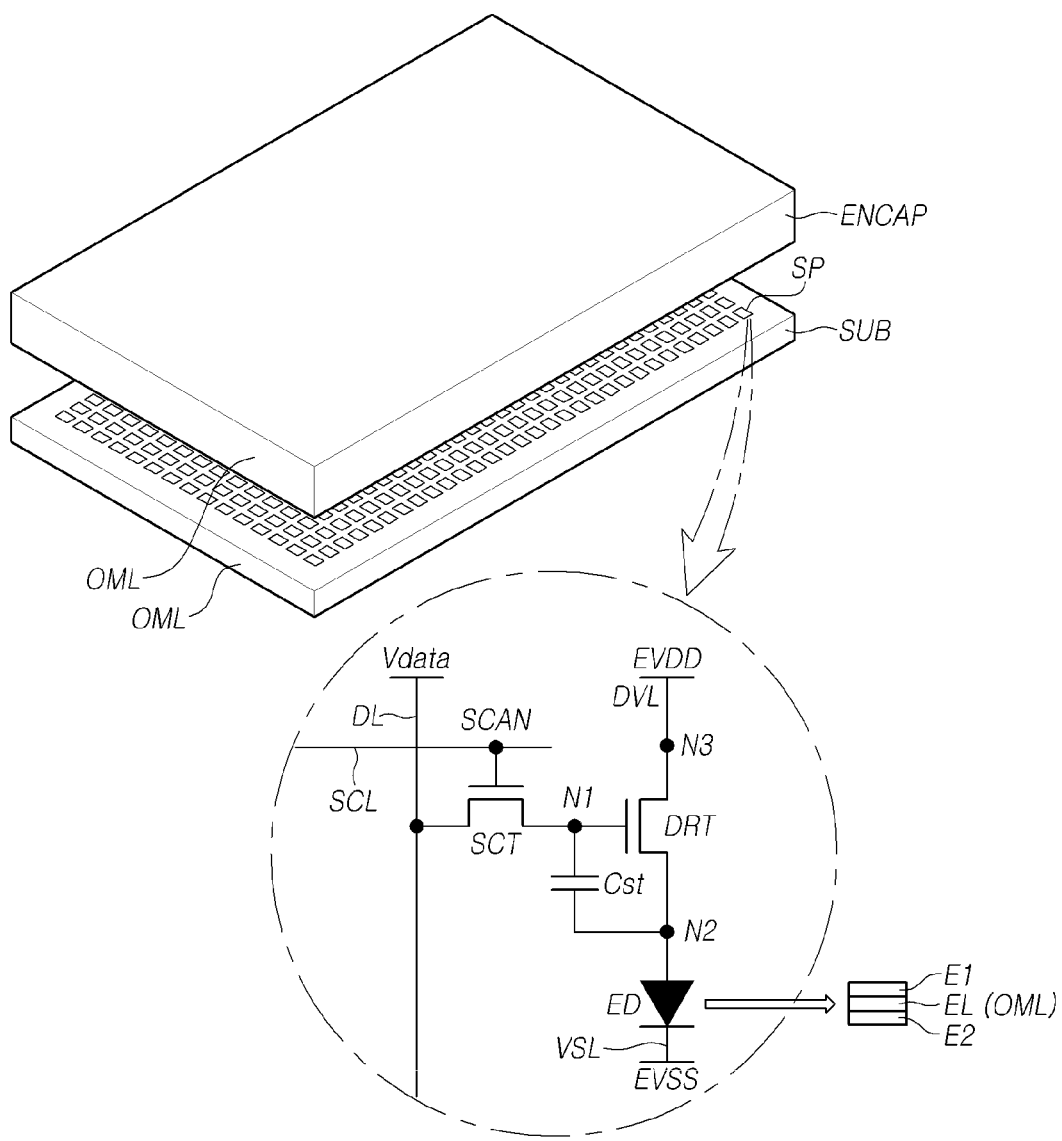
FIG. 2 is a view schematically illustrating a structure of a display panel of a touch display device according to exemplary embodiments of the disclosure.

FIG. 2 is a view schematically illustrating a structure of a display panel 100 of a touch display device 100 according to exemplary embodiments of the disclosure.

Referring to FIG. 2, the display panel 110 may include a plurality of subpixels SP formed on the substrate SUB. Each of the plurality of subpixels SP may include a light emitting element ED, a driving transistor DRT for driving the light emitting element ED, a scanning transistor SCT for transferring the data voltage Vdata to the first node N1 of the driving transistor DRT, and a storage capacitor Cst for maintaining a constant voltage, for example, during one frame.

The driving transistor DRT may include the first node N1 to which the data voltage Vdata may be applied, a second node N2 electrically connected with the light emitting element ED, and a third node N3 to which a first driving power signal EVDD is applied from a first driving power line DVL. The first node N1 in the driving transistor DRT may be a gate node, the second node N2 may be a source node or a drain node, and the third node N3 may be the drain node or the source node.

The light emitting element ED may include a first electrode E1, a light emitting layer EL, and a second electrode E2.

For example, the first electrode E1 may be respectively disposed in each subpixel SP and may be electrically connected to the second node N2 of the driving transistor DRT of each subpixel SP. For example, the second electrode E2 may be commonly disposed in the plurality of subpixels SP, and the second driving power signal EVSS may be applied thereto. The first electrode E1 is referred to as a pixel electrode, and the second electrode E2 is referred to as a common electrode.

Further, for example, the first electrode 1 may be an anode electrode. The second electrode 2 may be a cathode electrode. Conversely, the first electrode E1 may be a cathode electrode and the second electrode E2 may be an anode electrode.

The display panel 110 may further include a second driving power line VSL for supplying the second driving power signal EVSS to the second electrode E2.

In the following, for convenience of description, it is assumed that the first electrode E1 is a pixel electrode and an anode electrode, and the second electrode E2 is a common electrode and a cathode electrode.

For example, the light emitting element ED may be an organic light emitting diode (OLED), an inorganic light emitting diode, or a quantum dot light emitting element, etc. In this case, when the light emitting element ED is an organic light emitting diode, the light emitting layer EL of the light emitting element ED may include an organic film OML including an organic material.

The scanning transistor SCT is connected between the first node N1 of the driving transistor DRT and the corresponding data line DL, and may control the voltage state of the first node N1 of the driving transistor DRT.

The scanning transistor SCT may control the connection between the first node N1, which is the gate node of the driving transistor DRT, and the corresponding data line DL among the plurality of data lines DL according to the scanning gate signal SCAN supplied from the corresponding scanning gate line SCL among the plurality of scanning gate lines SCL, which are a type of the gate line GL.

The drain node or the source node of the scanning transistor SCT may be electrically connected to the corresponding data line DL. The source node or drain node of the scanning transistor SCT may be electrically connected to the first node N1 of the driving transistor DRT. The gate node of the scanning transistor SCT may be electrically connected to the scanning gate line SCL, which is a type of the gate line GL, to receive the scanning gate signal SCAN.

The scanning transistor SCT may be turned on by the scanning gate signal SCAN of a turn-on level voltage and transfer the data voltage Vdata supplied from the data line DL to the first node N1 of the driving transistor DRT.

The scanning transistor SCT is turned on by the scanning gate signal SCAN of the turn-on level voltage and turned off by the scanning gate signal SCAN of the turn-off level voltage. Here, when the scanning transistor SCT is of n type, the turn-on level voltage may be a high-level voltage, and the turn-off level voltage may be a low level voltage. When the scanning transistor SCT is of the p type, the turn-on level voltage may be a low-level voltage, and the turn-off level voltage may be a high level voltage.

The storage capacitor Cst may be electrically connected between the first node N1 and second node N2 of the driving transistor DRT.

The capacitor Cst may be an external capacitor intentionally designed to be outside the driving transistor DRT, but not a parasite capacitor (e.g., Cgs or Cgd) which is an internal capacitor that may be present between the first node N1 and the second node N2 of the driving transistor DRT.

Each of the driving transistor DRT and the scanning transistor SCT may be an n-type transistor or a p-type transistor.

As illustrated in FIG. 2, each subpixel SP may have a 2T (transistor) 1C (capacitor) structure which includes two transistors DRT and SCT and one capacitor Cst as shown in FIG. 2 and, in some cases, each subpixel SP may further include one or more transistors or one or more capacitors.

Since circuit elements (especially the light emitting element ED) in each subpixel SP are vulnerable to external moisture or oxygen, the display panel 110 may further include an encapsulation layer ENCAP. The encapsulation layer ENCAP may reduce or prevent external moisture or oxygen from penetrating into circuit elements (especially the light emitting element ED).

The encapsulation layer ENCAP may be disposed on the second electrode E2. The encapsulation layer ENCAP may have a single layer structure or may have a multilayer structure including several sub-encapsulation layers. For example, the encapsulation layer ENCAP may have a multilayer structure in which an inorganic encapsulation layer, an organic encapsulation layer, and an inorganic encapsulation layer are stacked.

As described above, the display panel 110 may include an organic film OML disposed inside the light emitting element ED or disposed above or below the light emitting element ED and including an organic material. As an example, to form the light emitting element ED, the light emitting layer EL may include an organic film OML including an organic material. As an example, the encapsulation layer ENCAP may include an organic encapsulation layer that is an organic film OML containing an organic material. As an example, an organic film OML including an organic material may be disposed under the encapsulation layer ENCAP, for example, for a planarization function or the like. As an example, an organic film OML including an organic material may be disposed on the encapsulation layer ENCAP. As such, an organic film OML containing an organic material may be disposed at various positions in the display panel 110 for various purposes.

The touch display device 100 according to exemplary embodiments of the disclosure may have a top emission structure in which light is emitted in a direction opposite to the substrate SUB of the display panel 110. In this case, as an example, the first electrode E1 which is a pixel electrode may be a reflective electrode (reflective material such as reflective metal) or a transparent electrode (transparent material such as transparent metal), and the second electrode E2 which is a common electrode may be a transparent electrode (transparent material such as transparent metal), without being limited thereto. As an example, the second electrode E2 may also be a reflective electrode or an opaque electrode. As an example, the touch display device 100 according to exemplary embodiments of the disclosure may also have a bottom emission structure in which light is emitted in a direction toward the substrate SUB of the display panel 110.

Figure 3:
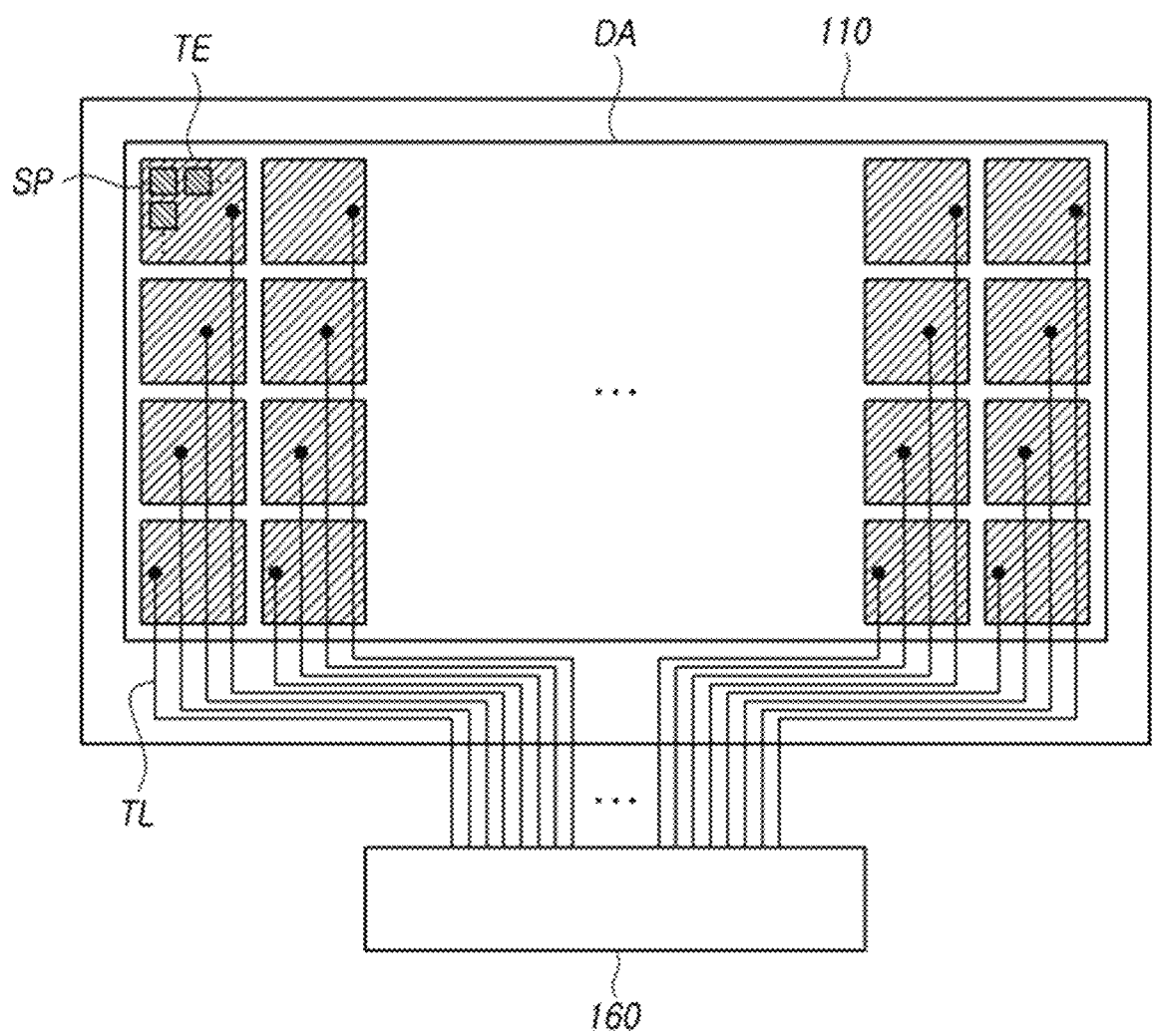
FIG. 3 is a view schematically illustrating a touch sensing system of a touch display device according to exemplary embodiments of the disclosure.

FIG. 3 is a view illustrating a touch sensing system of a touch display device 100 according to exemplary embodiments of the disclosure.

Referring to FIG. 3, the display panel 110 of the touch display device 100 may have a built-in touch panel. A touch panel embedded in the display panel 110 is also referred to as an embedded touch panel, an in-cell type touch panel, or an on-cell type touch panel.

Referring to FIG. 3, when the display panel 110 of the touch display device 100 according to exemplary embodiments of the disclosure has a built-in touch panel, as an example, the display panel 110 may include a touch sensor disposed in the display area DA. Embodiments are not limited thereto. As an example, the touch sensor may be disposed to overlap the display area DA. As an example, the touch sensor may be disposed to overlap the display area DA and at least a part of the non-display area NDA. As an example, the touch sensor may be disposed to overlap the entirety of the display area DA and at least a part of the non-display area NDA.

The touch sensor may include a plurality of touch electrodes TE separated from each other.

The touch sensor may further include a plurality of touch lines TL for electrically connecting each of the plurality of touch electrodes TE to the touch driving circuit 160. The touch lines TL are also referred to as touch routing lines.

According to the example of FIG. 3, each of the plurality of touch electrodes TE may be disposed apart from each other. In this case, the plurality of touch electrodes TE may not overlap each other in a vertical direction.

Alternatively, the plurality of touch electrodes TE may include touch electrodes TE in the first direction and touch electrodes TE in the second direction different from the first direction. In this case, the touch electrodes TE in the first direction and the touch electrodes TE in the second direction may cross each other. In this case, as an example, the touch electrodes TE in the first direction and the touch electrodes TE in the second direction may be disposed on different layers at least at the position where they cross each other.

According to the example of FIG. 3, one or more touch lines TL may be connected to each of a plurality of touch electrodes TE. Each touch line TL may electrically connect the corresponding touch electrode TE to the touch driving circuit 160.

Each touch line TL may overlap one or more touch electrodes TE.

Referring to FIG. 3, for example, among the touch electrodes TE disposed in the first column, the first touch electrodes TE disposed in the first row may be electrically connected to the first touch line TL. The first touch line TL may overlap some touch electrodes TE other than the first touch electrodes TE among the touch electrodes TE disposed in the first column without being electrically connected to the some touch electrodes TE.

Referring to FIG. 3, for example, when the touch display device 100 senses a touch based on self-capacitance, the touch driving circuit 160 may supply a touch driving signal to at least one of the plurality of touch electrodes TE and may sense the touch electrode TE to which the touch driving signal is supplied.

Each of the plurality of touch electrodes TE may be an electrode without an opening or a mesh-type electrode having a plurality of openings.

Each of the plurality of touch electrodes TE may be an opaque electrode or a transparent electrode. Alternatively, each of the plurality of touch electrodes TE may include an opaque electrode and a transparent electrode.

Each of the plurality of touch electrodes TE may be disposed in an area where two or more subpixels SP are formed. In this case, as an example, each of the plurality of touch electrodes TE may be a transparent electrode. As another example, the opening of each of the plurality of touch electrodes may overlap at least one subpixel. Alternatively, each of the plurality of touch electrodes TE may be positioned in an area that does not overlap the subpixel SP.

The sensing value for the touch electrode TE to which the touch driving signal is supplied may be a value corresponding to capacitance or a change in capacitance in the touch electrode TE to which the touch driving signal is supplied. The capacitance in the touch electrode TE to which the touch driving signal is supplied may be a capacitance between the touch electrode TE to which the touch driving signal is supplied and a touch object, such as a finger, a pen, etc.

As described above, in the touch display device 100 according to exemplary embodiments of the disclosure, if a touch sensor including a plurality of touch electrodes TE is embedded in the display panel 110, when patterns such as electrodes and lines related to driving of the display are formed during a manufacturing process of the display panel 110, the touch electrodes TE and the touch lines TL may also be formed.

Figure 4:
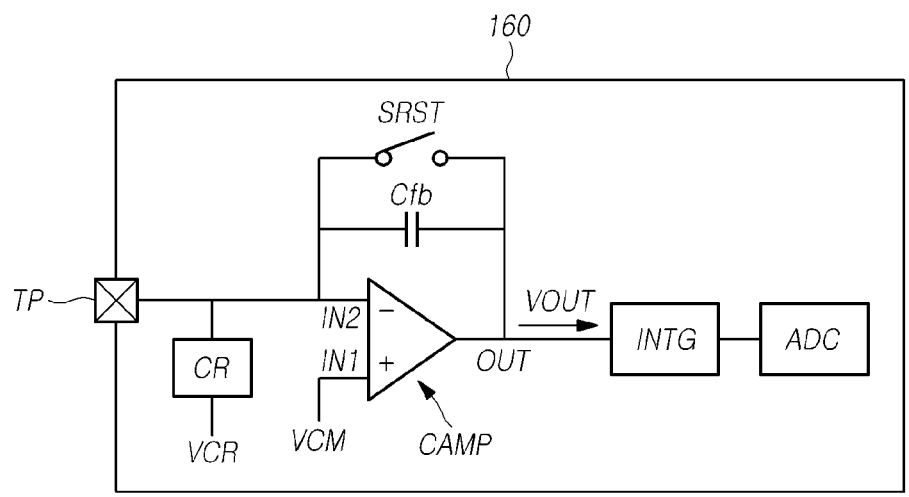
FIG. 4 is a view illustrating a touch driving circuit of a touch display device according to exemplary embodiments of the disclosure.

FIG. 4 is a view schematically illustrating a touch driving circuit 160 of a touch display device 100 according to exemplary embodiments of the disclosure.

Referring to FIG. 4, the touch driving circuit 160 may include S (where S is a natural number of 1 or more) charge amplifiers CAMP and Q (where Q is a natural number of 1 or more) analog-to-digital converters ADC.

The touch driving circuit 160 may further include a first selection circuit to select S touch lines TL from among a plurality of touch lines TL and electrically connect the selected touch lines TL to the S charge amplifiers CAMP. Further, the touch driving circuit 160 may further include a second selection circuit to select Q charge amplifiers among the S charge amplifiers CAMP and connect the selected Q charge amplifiers to the Q analog-to-digital converters ADC. As an example, S may be greater than Q, without being limited thereto.

Referring to FIG. 4, the charge amplifier CAMP may include a first input terminal IN1, a second input terminal IN2, and an output terminal OUT.

The charge amplifier CAMP may further include a feedback capacitor Cfb connected between the second input terminal IN2 and the output terminal OUT.

The charge amplifier CAMP may further include a reset switch SRST connected between the second input terminal IN2 and the output terminal OUT. While the touch driving circuit 160 performs an operation for touch sensing, the reset switch SRST may be in an off state.

A driving signal VCM may be input to the first input terminal IN1 of the charge amplifier CAMP. The second input terminal IN2 of the charge amplifier CAMP may be electrically connected to one touch pad TP selected from among a plurality of touch pads TP disposed on the display panel 110. Here, one touch line TL may be electrically connected to the touch pad TP electrically connected to the second input terminal IN2.

The driving signal VCM input to the first input terminal IN1 of the charge amplifier CAMP may be supplied to the touch line TL connected to the touch pad TP through the second input terminal IN2 of the charge amplifier CAMP. The driving signal VCM supplied to the touch line TL may be supplied to the touch electrode TE connected to the touch line TL.

Referring to FIG. 4, the touch driving circuit 160 may further include a charge removal circuit CR connected to the second input terminal IN2 of the charge amplifier CAMP. The charge removal circuit CR may control the amount of charge at the second input terminal IN2 of the charge amplifier CAMP according to the input charge removal control signal VCR.

When the charge is introduced into the second input terminal IN2 of the charge amplifier CAMP, the feedback capacitor Cfb may be charged. The output voltage VOUT corresponding to the amount of charge charged in the feedback capacitor Cfb may be output to the output terminal OUT of the charge amplifier CAMP.

The amount of charge charged in the feedback capacitor Cfb may vary depending on an electrical state (e.g., capacitance, etc.) of the touch electrode TE electrically connected to the second input terminal IN2 of the charge amplifier CAMP.

The analog-to-digital converter ADC may convert the output voltage VOUT output from the output terminal OUT of the charge amplifier CAMP into a digital value and output the digital value.

Referring to FIG. 4, the touch driving circuit 160 may further optionally include the integrator INTG connected between the output terminal OUT of the charge amplifier CAMP and the analog-to-digital converter ADC. The integrator INTG may integrate the output voltage VOUT output from the output terminal OUT of the charge amplifier CAMP to output the integral value of the output voltage VOUT, and the analog-to-digital converter ADC may convert the integral value into a digital value. Accordingly, the value output from the analog-to-digital converter ADC may have a value capable of more precise information processing.

For example, a value output from the analog-to-digital converter ADC during a touch period for touch sensing is referred to as a touch sensing value. The touch controller 170 may determine whether there is a touch and/or touch coordinates using the touch sensing value output from the analog-to-digital converter ADC.

FIG. 5 is a view illustrating a change in touch sensitivity when a thermal drift occurs due to a touch pointer in a touch display device 100 according to exemplary embodiments of the disclosure.

The three graphs 500, 510, and 520 illustrated in FIG. 5 are graphs illustrating a touch sensing value output from the touch driving circuit 160 from before a touch occurs to after a touch occurs when the user touches with a touch pointer such as a finger or a pen for a predetermined time.

The reference graph 500 shows a touch sensing value over time for a general driving state in which the temperature of the touch pointer is not transferred to the display panel 110 when the user touches the display panel 110 with a touch pointer such as a finger or a pen.

Referring to the reference graph 500, a touch sensing value before a touch occurs may have a threshold value. Here, the threshold value may be a touch sensing value naturally caused by the parasitic capacitance Cp formed on the corresponding touch electrode TE inside the display panel 110 before the touch occurs.

Referring to the reference graph 500, when a touch occurs, a finger capacitance between a corresponding touch electrode TE and the finger may be formed, and accordingly, the touch sensing value may increase. The increased touch sensing value may be determined by the parasitic capacitance Cp and the finger capacitance Cfinger. Here, the finger capacitance may be self-capacitance.

Referring to the reference graph 500, after the touch occurs, the touch sensing value may remain constant during the period when the touch is maintained after the touch increases.

Referring to the reference graph 500, when the user removes the touch, i.e., when the touch is terminated, the finger capacitance disappears, and the touch sensing value decreases to become the level of the state before the touch occurs.

Referring to FIG. 5, the first graph 510 and the second graph 520 illustrate touch sensing values over time with respect to the state in which the temperature of the touch pointer is transferred to the display panel 110, when the user touches the display panel 110 with the touch pointer such as the finger or the pen and the temperature of the touch pointer is higher than the temperature of the display panel 110. Embodiments are not limited thereto. As an example, in some cases, the temperature of the touch pointer may also be lower than the temperature of the display panel 110.

Referring to FIG. 5, referring to the first graph 510, before the touch occurs, the touch sensing value may have a threshold value. Here, the threshold value may be a touch sensing value naturally caused by the parasitic capacitance Cp formed on the corresponding touch electrode TE inside the display panel 110 even before the touch occurs.

Referring to the first graph 510, when a touch occurs, a finger capacitance between the corresponding touch electrode TE and the finger may be formed, and accordingly, the touch sensing value may increase. The increased touch sensing value may be determined by the parasitic capacitance Cp and the finger capacitance Cfinger.

Referring to the first graph 510, after the occurrence of the touch, during a period when the touch is maintained, the touch sensing value may not remain constant, but the touch sensing value may additionally increase.

As a result of analyzing the cause of the additional increase in the touch sensing value, the following analysis results were obtained. When the temperature of the touch pointer touching the display panel 110 is higher than the surface temperature of the display panel 110 (or the temperature of the corresponding touch electrode TE), the temperature of the touch pointer may be transferred to the display panel 110 to cause a temperature change (temperature increase) in the display panel 110. Accordingly, the parasitic capacitance at the touch electrode TE may increase, leading to an additional increase in the touch sensing value.

As the temperature of the touch pointer is transferred to the display panel 110, the permittivity of the organic material constituting the organic film OML included in the display panel 110 may be changed by the temperature change (temperature increase) of the display panel 110. Accordingly, the parasitic capacitance at the corresponding touch electrode TE may increase. The parasitic capacitance increase ΔCp at the corresponding touch electrode TE may further increase the touch sensing value. Here, during the touch generation time, the parasitic capacitance increase ΔCp is a phenomenon caused by the organic material when the temperature rises, and may correspond to the material-wise intrinsic characteristics of the organic material.

As shown in the first graph 510, when the temperature of the touch pointer is higher than the surface temperature of the display panel 110, a phenomenon in which the parasitic capacitance increases (ΔCp) due to the high temperature influence of the touch pointer during the touch occurrence time may be referred to as a positive thermal drift phenomenon.

Referring to the first graph 510, when the user releases the touch, i.e., when the touch is terminated, the touch sensing value does not immediately fall to the level before the touch occurs, and even after the touch is terminated, the touch sensing value has a level larger than or equal to the threshold value for a little time. For this reason, even after the touch is terminated, it may be recognized as if the touch still exists. As described above, a touch that does not actually exist but is recognized as if it exists is referred to as a ghost touch, and when the ghost touch is recognized, a significant decrease in touch sensitivity may occur.

Referring to FIG. 5, referring to the second graph 520, before the touch occurs, the touch sensing value may have the threshold value. Here, the threshold value may be a touch sensing value naturally caused by the parasitic capacitance Cp formed on the corresponding touch electrode TE inside the display panel 110 even before the touch occurs.

Referring to the second graph 520, when the touch occurs, the finger capacitance between the corresponding touch electrode TE and the finger may be formed, and accordingly, the touch sensing value may increase. The increased touch sensing value may be determined by the parasitic capacitance Cp and the finger capacitance Cfinger.

Referring to the second graph 520, after the occurrence of the touch, during a period when the touch is maintained, the touch sensing value may not remain constant, but the touch sensing value may rather decrease.

As a result of analyzing the cause of the decrease in the touch sensing value, the following analysis results were obtained. When the temperature of the touch pointer touching the display panel 110 is higher than the surface temperature of the display panel 110 (or the temperature of the corresponding touch electrode TE), the temperature of the touch pointer may be transferred to the display panel 110 to change the temperature of the display panel 110. Accordingly, the parasitic capacitance in the touch electrode TE may be reduced, leading to a decrease in the touch sensing value.

As the temperature of the touch pointer is transferred to the display panel 110, the permittivity of the organic material constituting the organic film OML included in the display panel 110 may change according to a temperature change (temperature increase). Accordingly, due to the inherent characteristics of the corresponding organic material, the parasitic capacitance at the corresponding touch electrode TE may be reduced. The parasitic capacitance reduction (ΔCp) at the corresponding touch electrode TE may reduce the touch sensing value. Here, during the touch generation time, the parasitic capacitance reduction (ΔCp) is a phenomenon caused by the organic material when the temperature rises, and may correspond to the material intrinsic characteristics of the organic material.

As shown in the second graph 520, when the temperature of the touch pointer is higher than the surface temperature of the display panel 110, a phenomenon in which parasitic capacitance reduction (ΔCp) occurs due to the high temperature influence of the touch pointer during the touch occurrence time may be referred to as a negative thermal drift phenomenon.

As described above, when the touch sensing value decreases while the user maintains the touch, the signal-to-noise ratio (SNR) may decrease and the touch sensitivity may decrease.

Figure 6A:
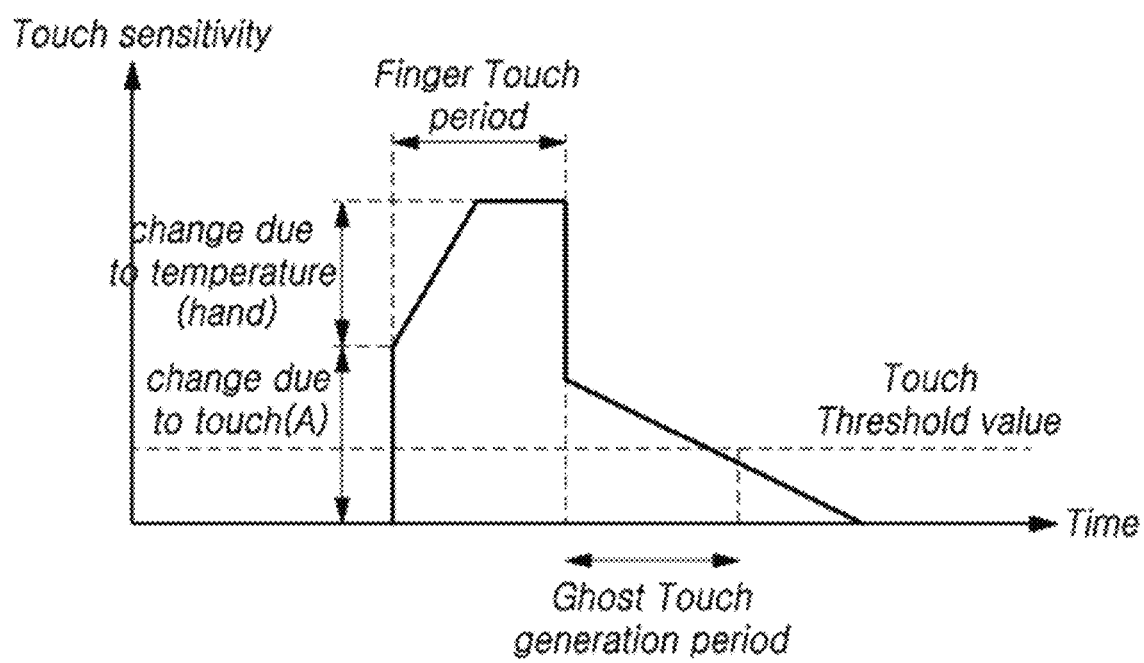
FIG. 6A is a view illustrating a change in touch sensitivity due to a finger touch in a touch display device according to exemplary embodiments of the disclosure.

FIG. 6A is a view illustrating a change in touch sensitivity (change in touch sensing value) due to a finger touch in a touch display device 100 according to exemplary embodiments of the disclosure.

Referring to FIG. 6A, when a finger touch occurs, the temperature of the finger may be transferred to the display panel 110, and a positive heat drift phenomenon may occur.

Referring to FIG. 6A, the temperature change of the display panel 110 may be caused by a finger touch. The variation in the touch sensing value due to the temperature change of the display panel 110 according to the finger touch may include the variation A in the touch sensing value due to the finger touch and the variation B in the touch sensing value according to the temperature of the finger.

The variation A in the touch sensing value by the finger touch is a normal part that is essential for touch sensing and may be a part generated by the finger capacitance.

The variation B in the touch sensing value according to the temperature of the finger may be an unwanted part that may cause a decrease in touch sensitivity, and may be a part generated by an increase in parasitic capacitance ($\Delta Cp$) due to a positive heat drift phenomenon during the finger touch period.

After the finger touch disappears, the touch sensing value decreases, but does not immediately fall to the level before the touch occurs, but may rather have a value larger than or equal to the touch threshold for a predetermined time. Here, the touch threshold value may mean a minimum touch sensing value for considering that a touch has occurred.

Even if the finger touch is removed, if a touch sensing value larger than or equal to the touch threshold value is obtained from the touch driving circuit 160 for a predetermined time (ghost touch generation period), the touch controller 170 may erroneously recognize that the touch has occurred. The recognition of a ghost touch may significantly reduce touch sensitivity.

Figure 6B:
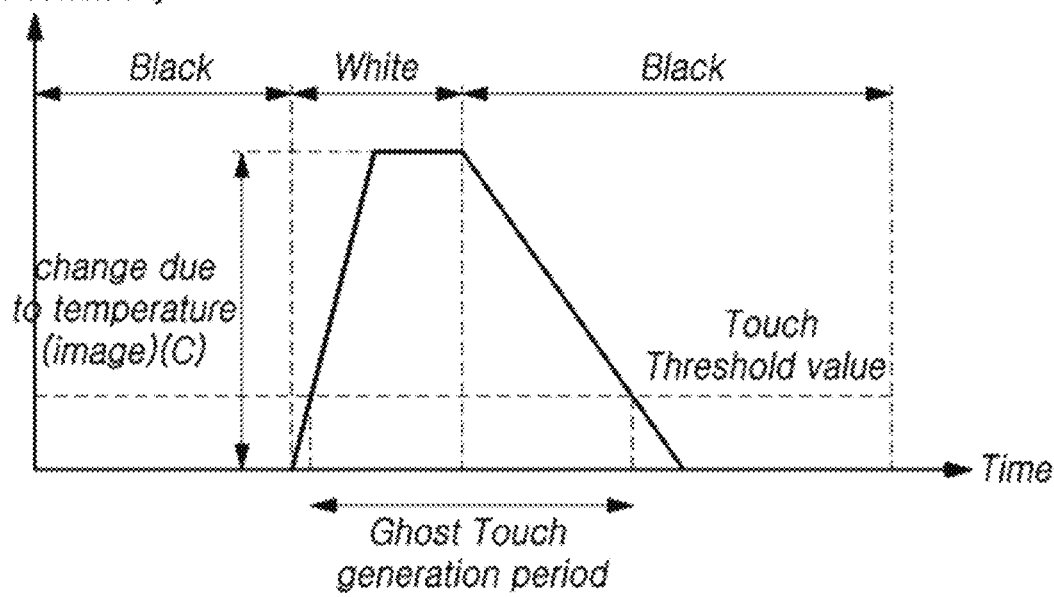
FIG. 6B is a view illustrating a change in touch sensitivity due to an image change in a touch display device according to exemplary embodiments of the disclosure.

FIG. 6B is a view illustrating a change in touch sensitivity (change in touch sensing value) due to an image change in a touch display device 100 according to exemplary embodiments of the disclosure.

Referring to FIG. 6B, touch sensitivity may be decreased not only by finger touch but also by image change.

Referring to FIG. 6B, it may be seen that a phenomenon in which the surface temperature of the display panel 110 is increased by a finger touch occurs similarly even when an image is changed. In other words, when the image is changed, a positive heat drift phenomenon may occur similarly. In other words, although no touch is generated, a change in the touch sensing value may occur due to an image change.

Referring to FIG. 6B, the variation in the touch sensing value due to the image change may be regarded as the variation C in the touch sensing value according to the temperature change of the display panel 110 corresponding to the image change.

For example, when a low grayscale image (e.g., a black image) is changed to a high grayscale image (e.g., a white image), a touch sensing value larger than or equal to a touch threshold value may be obtained from the touch driving circuit 160 even though a touch does not actually occur. When the high grayscale image (e.g., the white image) is changed back to the low grayscale image (e.g., the black image), the touch sensing value may not fall immediately below the touch threshold, but may rather fall below the touch threshold after a little time elapses.

Referring to FIG. 6B, even if a touch does not actually occur, when a touch sensing value larger than or equal to a touch threshold value is obtained from the touch driving circuit 160 according to an image change, the touch controller 170 may recognize that a touch occurs during a period (a period when a ghost touch occurs) in which the touch sensing value is larger than or equal to the touch threshold value. The recognition of a ghost touch may significantly reduce touch sensitivity.

Accordingly, embodiments of the disclosure suggest a temperature sensing structure and a temperature sensing method capable of reducing or preventing a decrease in touch sensitivity according to a temperature change of the display panel 110, and a method for compensating for a change in touch sensitivity according to a temperature change.

Hereinafter, a temperature sensing structure and a temperature sensing method according to exemplary embodiments of the disclosure and a method for compensating for a change in touch sensitivity according to a change in temperature are described. Here, the temperature change of the display panel 110 may be caused by the temperature of a touch pointer such as a finger or a pen, or may be related to an image change, without being limited thereto. As an example, the temperature change of the display panel 110 may also be caused by the temperature change of the surroundings, the operation of an internal component of the touch display device 100, etc.

Figure 7C:
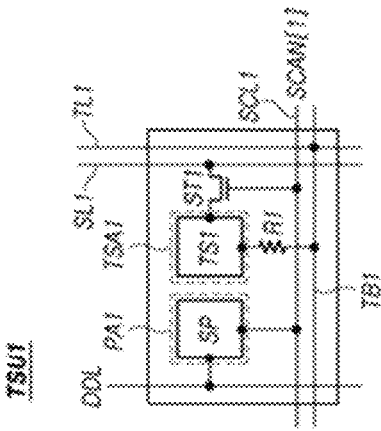
FIG. 7C is a view illustrating a structure of a first touch sensor unit area TSU1 of a plurality of touch sensor unit areas TSU.
Figure 7B:
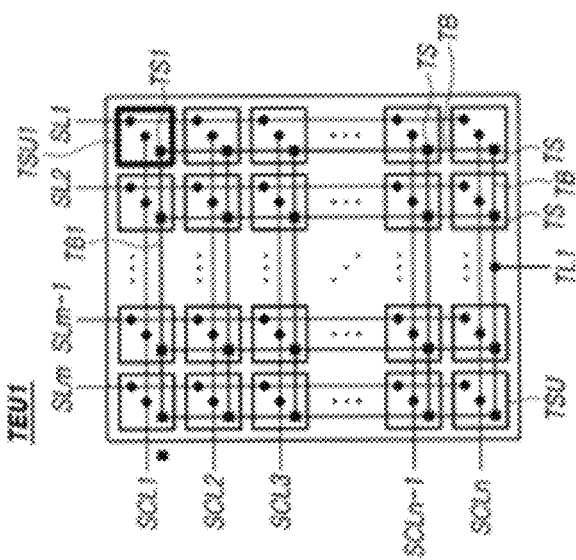
FIG. 7B is a view illustrating a first touch electrode area TEU1, which represents a structure of a first touch electrodes TE1 of a plurality of touch electrodes TE which is formed in a touch panel area TSP, having a plurality of touch sensor unit areas TSU.
Figure 7A:
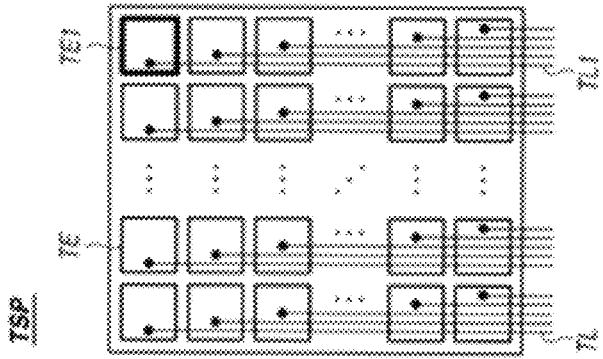
FIG. 7A is a view illustrating a touch panel area TSP having a plurality of touch electrodes TE.

FIGS. 7A, 7B, and 7C are views illustrating a touch sensor configuration for compensating for a change in touch sensitivity due to a change in temperature of a display panel 110 in a touch display device 100 according to exemplary embodiments of the disclosure.

Referring to FIG. 7, the touch panel area TSP in the display panel 110 may include a plurality of touch electrodes TE and a plurality of touch lines TL. The plurality of touch lines TL may be connected to the plurality of touch electrodes TE, respectively.

The plurality of touch electrodes TE may include a first touch electrode TE1, and the plurality of touch lines TL may include a first touch line TL1 connected to the first touch electrode TE1.

Referring to FIGS. 7A, 7B, and 7C, as an example, each of the plurality of touch electrodes TE may not be a single plate-shaped electrode, but may be composed of several touch sensors TS connected by touch bridge lines TB. The configuration of each of the plurality of touch electrodes TE is described with the first touch electrode TE1 as an example.

Referring to FIGS. 7A, 7B, and 7C, the first touch electrode area TEU1 in which the first touch electrode TE1 is formed may include touch sensors TS arranged in n rows and m columns. In other words, the first touch electrode area TEU1 in which the first touch electrode TE1 is formed may include (n×m) touch sensors TS.

The first touch electrode area TEU1 may include touch bridge lines TB that electrically connect all of the (n×m) touch sensors TS.

The touch bridge lines TB included in the first touch electrode area TEU1 may include row-wise touch bridge lines TB for connecting the touch sensors TS arranged in the same row and column-wise touch bridge lines TB for connecting the touch sensors TS arranged in the same column Embodiments are not limited thereto. As an example, the touch bridge lines TB may also include touch bridge lines T extending along a diagonal direction for connecting the touch sensors TS arranged in the same diagonal line.

Referring to FIGS. 7A, 7B, and 7C, the (n×m) touch sensors TS included in the first touch electrode area TEU1 may include a first touch sensor TS1.

The touch bridge lines TB included in the first touch electrode area TEU1 may include a first touch bridge line TB1 for connecting the first touch sensor TS1 to another touch sensor TS adjacent thereto in the row direction.

Referring to FIGS. 7A, 7B, and 7C, the first touch electrode area TEU1 may include (n×m) touch sensor unit areas TSU. The (n×m) touch sensor unit areas TSU are areas corresponding to the (n×m) touch sensors TS, respectively.

To describe the structure of each of the (n×m) touch sensor unit areas TSU, the first touch sensor unit area TSU1 in which the first touch sensor TS1 is positioned is exemplified.

Referring to FIGS. 7A, 7B, and 7C, the first touch sensor unit area TSU1 may include a first pixel area PA1 in which at least one first subpixel SP is disposed and a first touch sensor area TSA1 in which the first touch sensor TS1 is disposed.

The first touch sensor area TSA1 may be positioned on one side of the first pixel area PA1, without being limited thereto. As an example, the first touch sensor area TSA1 may be positioned on one or more sides of the first pixel area PA1.

The first subpixel SP disposed in the first pixel area PA1 may include a light emitting element ED, a scanning transistor SCT, and the like. The first subpixel SP may be configured as shown in FIG. 2.

Referring to FIGS. 7A, 7B, and 7C, the first display driving line DDL may be disposed across the first touch sensor unit area TSU1. The first display driving line DDL may be connected to the first subpixel SP1.

Referring to FIGS. 7A, 7B, and 7C, a first touch line TL1 may be disposed across a first touch sensor unit area TSU1. The first touch line TL1 may be electrically connected to the first touch sensor TS1. The first touch line TL1 may be connected to the touch driving circuit 160. As an example, the first touch line TL1 may be connected to the first touch bridge line TB1, without being limited thereto.

Referring to FIGS. 7A, 7B, and 7C, the touch display device 100 according to exemplary embodiments of the disclosure may further include a first sensing line SL1 disposed adjacent to the first touch sensor TS1, and a first sensing transistor ST1 to control an electrical connection between the first sensing line SL1 and the first touch sensor TS1.

Referring to FIGS. 7A, 7B, and 7C, the first sensing line SL1 may be disposed across the first touch sensor unit area TSU1, and the first sensing transistor ST1 may be disposed in the first touch sensor unit area TSU1. As an example, the first sensing line SL1 may be disposed in parallel with the first touch line TL1, without being limited thereto.

Referring to FIGS. 7A, 7B, and 7C, the first scanning gate line SCL1 may be electrically connected to the gate node of the scanning transistor SCT in the first subpixel SP. The first scanning gate line SCL1 may supply the first scanning gate signal SCAN[1] to the gate node of the scanning transistor SCT in the first subpixel SP.

Referring to FIG. 7C, the first scanning gate line SCL1 may be electrically connected to the gate node of the first sensing transistor ST1 in the first touch sensor unit area TSU1.

Accordingly, the first scanning gate line SCL1 may simultaneously supply the first scanning gate signal SCAN[1] for simultaneously controlling the on/off of the first sensing transistor ST1 and the scanning transistor SCT in the first subpixel SP to the scanning transistor SCT and the first sensing transistor ST1. Embodiments are not limited thereto. As an example, the first sensing transistor ST1 and the scanning transistor SCT may also be controlled by separate gate lines.

Accordingly, as an example, the first sensing transistor ST1 and the scanning transistor SCT in the first subpixel SP may be simultaneously turned on or off.

As an example, while the scanning transistor SCT in the first subpixel SP is turned on, the first sensing transistor ST1 may be turned on, and the first touch sensor TS1 and the first sensing line SL1 may be electrically connected to each other.

In other words, when the first touch sensor TS1 and the first sensing line SL1 are connected, the scanning transistor SCT in the first subpixel SP may be in a turned-on state.

While the scanning transistor SCT in the first subpixel SP is turned off, the first sensing transistor ST1 may be turned off, and thus the first touch sensor TS1 and the first sensing line SL1 may be electrically separated from each other.

In other words, when the first touch sensor TS1 and the first sensing line SL1 are not connected, the scanning transistor SCT in the first subpixel SP may be in a turned-off state. As an example, the first sensing transistor ST1 and the scanning transistor SCT may have the same type. Embodiments are not limited thereto. As an example, the first sensing transistor ST1 and the scanning transistor SCT may have opposite types, such that only one of the first sensing transistor ST1 and the scanning transistor SCT may be turned on at the same time.

Referring to FIG. 7C, the touch display device 100 according to exemplary embodiments of the disclosure may further include a first touch bridge line TB1 for electrical connection between the first touch sensor TS1 and the first touch line TL1.

Referring to FIG. 7C, a first sensing resistor R1 may be connected between the first touch line TL1 and the first touch sensor TS1.

The first sensing resistor R1 may be a resistor connected between the first touch bridge line TB1 and the first touch sensor TS1. Alternatively, the first sensing resistor R1 may be a resistor connected between an extension of the first touch bridge line TB1 and the first touch sensor TS1. Alternatively, the first sensing resistor R1 may be an extension of the first touch bridge line TB1. Alternatively, the first sensing resistor R1 may be a resistor present in the first touch bridge line TB1, or may be a resistance component of the first touch bridge line TB1 or an extension thereof.

Referring to FIGS. 7A, 7B, and 7C, the display panel 110 may further include one or more display common electrodes corresponding to the second electrode E2 of the light emitting element ED of the first subpixel SP.

When one display common electrode is included in the display panel 110, one display common electrode may be disposed in the entire area of the display panel 110 and may be one undivided metal.

Alternatively, when the display panel 110 includes a plurality of display common electrodes, each of the plurality of display common electrodes may be disposed only in the pixel area in each touch sensor unit area TSU. For example, one display common electrode may be disposed in the first pixel area PA1 in the first touch sensor unit area TSU1. Embodiments are not limited thereto. As an example, each of the plurality of display common electrodes may also be disposed in pixel areas of more than one touch sensor unit areas TSU.

Referring to FIG. 7C, the first display driving line DDL may be various signal lines for display driving.

For example, the first display driving line DDL may include at least one of a data line DL for supplying the data voltage Vdata to the first subpixel SP, a first driving power line DVL for supplying the first driving power signal EVDD to the first subpixel SP, a second driving power line VSL for supplying the second driving power signal EVSS to the first subpixel SP, or a reference voltage line for supplying the reference voltage to the first subpixel SP.

For example, when the first display driving line DDL is the second driving power line VSL, the first display driving line DDL may be the second driving power line VSL that may be connected to the second electrode E2 of the first electrode E1 and the second electrode E2 of the light emitting element ED.

In this case, the first display driving line DDL, which is the second driving power line VSL, may be electrically connected to the second electrode E2 corresponding to the display common electrode of the first electrode E1 and the second electrode E2 of the light emitting element ED of the first subpixel SP in the first pixel area PA1.

The first touch sensor TS1 disposed in the first touch sensor area TSA1 may include the same material as the display common electrode. For example, in the process of manufacturing the display panel, the display common electrodes (the second electrodes E2) and the touch sensors TS may be formed to be separated from each other by patterning the display common electrode material (e.g., the cathode electrode material).

Meanwhile, referring to FIGS. 7A, 7B, and 7C, in the first touch sensor unit area TSU1, the first pixel area PA1 may be a non-transmissive area through which light is not transmitted, and the first touch sensor area TSA1 may be a transmissive area through which light may be transmitted so that the rear background may be viewed from the front surface. Accordingly, the first touch sensor TS1 may be formed of a transparent electrode material. Further, the display common electrode disposed in the first pixel area PA1 may be formed of the same transparent electrode material as the first touch sensor TS1. Embodiments are not limited thereto. As an example, the first touch sensor area TSA1 may also be a non-transmissive area through which light is not transmitted. In this case, the first touch sensor TS1 may be formed of a transparent electrode material or an opaque electrode material.

Figure 8:
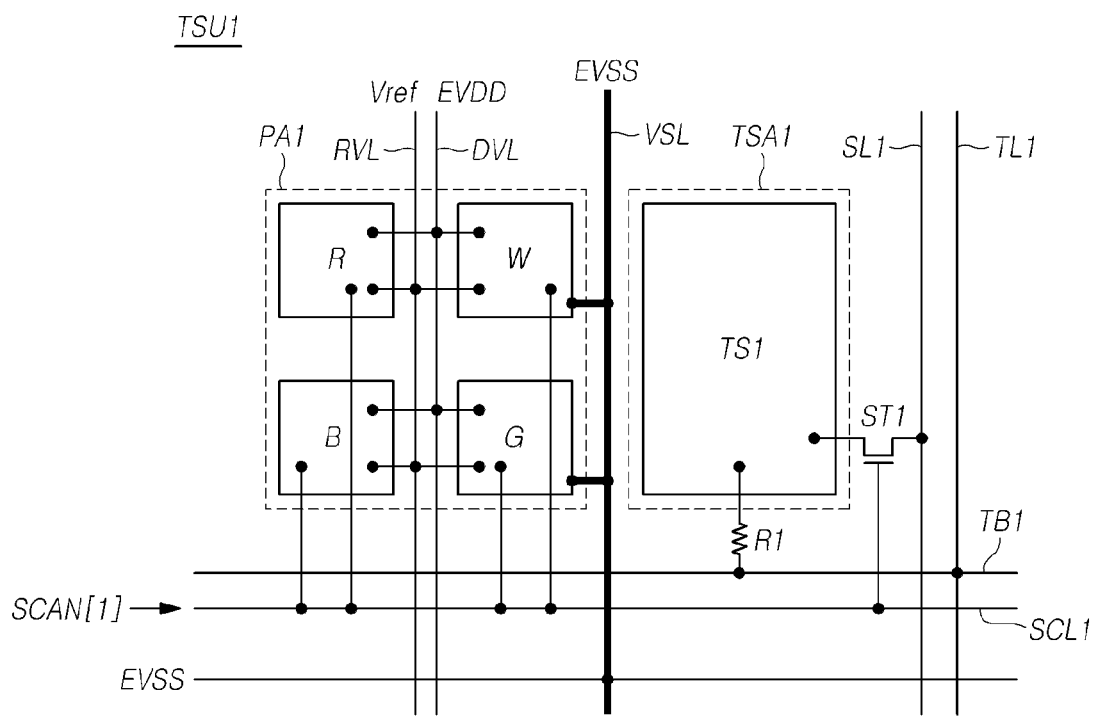
FIG. 8 is a view illustrating a detailed view of the first touch sensor unit area of FIG. 7 according to exemplary embodiments of the disclosure.

FIG. 8 is a view illustrating in greater detail the first touch sensor unit area TSU1 of FIGS. 7A, 7B, and 7C according to exemplary embodiments of the disclosure.

The structure of the first touch sensor unit area TSU1 of FIG. 8 illustrates the structure of the first touch sensor unit area TSU1 of FIGS. 7A, 7B, and 7C in more detail. Accordingly, in describing the structure of the first touch sensor unit area TSU1 of FIG. 8, matters different from the structure of the first touch sensor unit area TSU1 of FIGS. 7A, 7B, and 7C are mainly described.

Referring to FIG. 8, three first display driving lines DDL including a first driving power line DVL, a second driving power line VSL, and a reference voltage line RVL may be disposed in the column direction.

Referring to FIG. 8, four subpixels (e.g., four subpixels R, W, B, and G) may be disposed in the first pixel area PA1. For example, the four subpixels R, W, B, and G may include a red subpixel R emitting red light, a white subpixel W emitting white light, a blue subpixel B emitting blue light, and a green subpixel G emitting green light, without being limited thereto. As an example, the white subpixel W may be omitted. As another example, subpixels emitting light of other colors are also possible.

For example, in the first pixel area PA1, the four subpixels R, W, B, and G may be arranged in two rows and two columns.

Referring to FIG. 8, the reference voltage line RVL and the first driving power line DVL may be disposed across the first pixel area PA1 in the column direction.

Referring to FIG. 8, the second driving power line VSL may be positioned between the first pixel area PA1 and the first touch sensor area TSA1 and may be disposed in the column direction. As an example, the auxiliary line connected the subpixels to the second driving power line VSL may be disposed in the row direction.

Referring to FIG. 8, in the first touch sensor unit area TSU1, the first pixel area PA1 may be a non-transmissive area through which light is not transmitted, and the first touch sensor area TSA1 may be a transmissive area through which light may be transmitted, without being limited thereto.

The first touch sensor TS1 may be formed of a transparent electrode material. Further, one display common electrode disposed in the first pixel area PA1 may be formed of the same transparent electrode material as the first touch sensor TS1, without being limited thereto. As an example, the display common electrode disposed in the first pixel area PA1 may be formed of an opaque electrode material or a transparent electrode material different from the transparent electrode material of the first touch sensor TS1.

As described above, as a temperature change of the display panel 110 occurs due to a touch of a touch pointer (e.g., a finger or a pen) higher than the surface temperature of the display panel 110, or an image change occurs, etc., an unwanted parasitic capacitance change ($\Delta Cp$) may be caused in the touch electrode TE, thereby reducing touch sensitivity.

In the exemplary embodiments of the disclosure, since the image change has an effect equal to the temperature change of the display panel 110, for convenience of description, even if it is described that the temperature change of the display panel 110 is caused by a touch of a touch pointer (e.g., a finger or a pen) higher than the surface temperature of the display panel 110, the temperature change of the display panel 110 should be considered as a concept including the image change. Here, the image change may mean a change in the grayscale of the image. Also, the touch pointer may include a finger, a pen, and the like, but hereinafter, for convenience of description, a finger is described as an example.

The touch display device 100 according to exemplary embodiments of the disclosure may include a temperature sensing structure to compensate for a decrease in touch sensitivity due to a temperature change of the display panel 110 caused by a finger touch.

The temperature sensing structure included in the touch display device 100 according to exemplary embodiments of the disclosure may be included in each of the plurality of touch sensor unit areas TSU. Embodiments are not limited thereto. As an example, the temperature sensing structure may be included in at least one or some of the plurality of touch sensor unit areas TSU.

Referring to FIGS. 7 and 8, the temperature sensing structure related to the first touch sensor unit area TSU1 may include a first sensing transistor ST1, a first sensing resistor R1, a first sensing line SL1, a first touch sensor TS1, and a first touch line TL1.

Hereinafter, a temperature sensing method using a temperature sensing structure and a touch sensitivity change compensation method based on temperature sensing according to exemplary embodiments of the disclosure are described.

Figure 9:
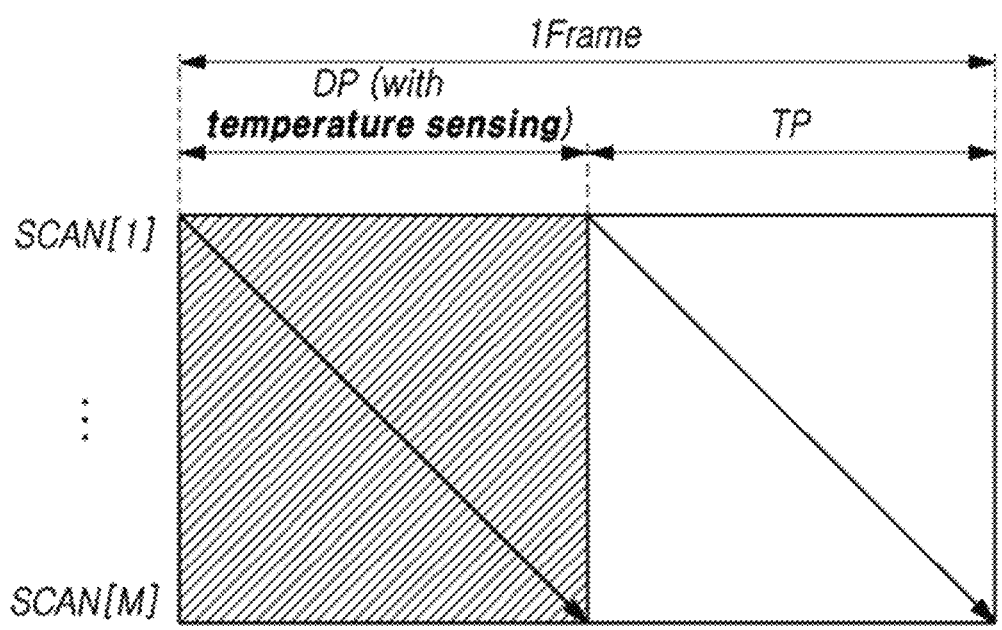
FIG. 9 is a view illustrating a driving timing of a touch display device according to exemplary embodiments of the disclosure.

FIG. 9 is a view illustrating a driving timing of a touch display device 100 according to exemplary embodiments of the disclosure.

Referring to FIG. 9, the touch display device 100 according to exemplary embodiments of the disclosure may divide one frame time into one display period DP and one touch period TP, perform display driving for image displaying (image update) during the display period DP, and perform touch driving for touch sensing during the touch period TP.

Alternatively, the touch display device 100 according to embodiments of the disclosure may divide one frame time into a plurality of display periods DP and a plurality of touch periods TP, perform display driving for image displaying (image update) during each display period DP, and perform touch driving for touch sensing during each touch period TP. In this case, the display periods DP and the touch periods TP may be alternated.

As illustrated in FIGS. 7 and 8, in the first touch sensor unit area TSU1, the first scanning gate line SCL1 may be simultaneously connected to the gate node of the scanning transistor SCT of the first subpixel SP and the gate node of the first sensing transistor ST1.

Accordingly, in the first touch sensor unit area TSU1, the first scanning gate line SCL1 may simultaneously supply the first scanning gate signal SCAN[1] to the gate node of the scanning transistor SCT of the first subpixel SP and the gate node of the first sensing transistor ST1.

Accordingly, in the first touch sensor unit area TSU1, the first sensing transistor ST1 and the scanning transistor SCT in the first subpixel SP may be simultaneously turned on or off.

As described above, as illustrated in FIG. 9, the touch display device 100 according to embodiments of the disclosure may simultaneously perform a temperature sensing operation during the display period DP.

The first sensing transistor ST1 in the first touch sensor unit area TSU1 may be turned on during the display period DP during which the data voltage for image displaying is supplied to the first subpixel SP in the first touch sensor unit area TSU1.

In other words, during a period when the first sensing transistor ST1 in the first touch sensor unit area TSU1 is turned on, i.e., during a period when the temperature sensing operation is executed, a data voltage Vdata for image displaying may be supplied to the first subpixel SP in the first touch sensor unit area TSU1.

During the touch period TP different from the display period DP, the first sensing transistor ST1 in the first touch sensor unit area TSU1 may be turned off. In this case, the scanning transistor SCT of the first subpixel SP in the first touch sensor unit area TSU1 may be in a turned-off state.

The touch display device 100 according to exemplary embodiments of the disclosure may perform temperature sensing processing on each of the plurality of touch sensor unit areas TSU included in each of the plurality of touch electrode areas TEU. Embodiments are not limited thereto. As an example, the touch display device 100 may perform temperature sensing processing on some of the plurality of touch sensor unit areas TSU included in some of the plurality of touch electrode areas TEU in each display period DP.

Hereinafter, temperature sensing processing on the first touch sensor unit area TSU1 in the first touch electrode area TEU1 is described as an example.

The first sensing transistor ST1 disposed in the first touch sensor unit area TSU1 may have a characteristic in which mobility changes according to a temperature change. By utilizing these characteristics, it is possible to determine a temperature change in the first touch sensor unit area TSU1.

The touch display device 100 according to exemplary embodiments of the disclosure may measure a current flowing through the first sensing transistor ST1 disposed in the first touch sensor unit area TSU1, and may sense a temperature based on the measured current. Here, the current flowing through the first sensing transistor ST1 may vary depending on the mobility of the first sensing transistor ST1. When the mobility of the first sensing transistor ST1 increases, the amount of current flowing through the first sensing transistor ST1 may increase.

Temperature sensing of the touch display device 100 according to exemplary embodiments of the disclosure may be performed according to two driving methods, without being limited thereto. Depending on the two driving methods, the line on which current sensing for temperature sensing is performed may vary, and the driving methods for each of the first sensing line SL1 and the first touch line TL1 may vary.

The two driving methods may include a first driving method in which the first sensing line SL1 becomes a current sensing path and a second driving method in which the first touch line TL1 becomes a current sensing path. Hereinafter, the first driving method is described in detail first, and then the second driving method is described in detail.

Figure 10:
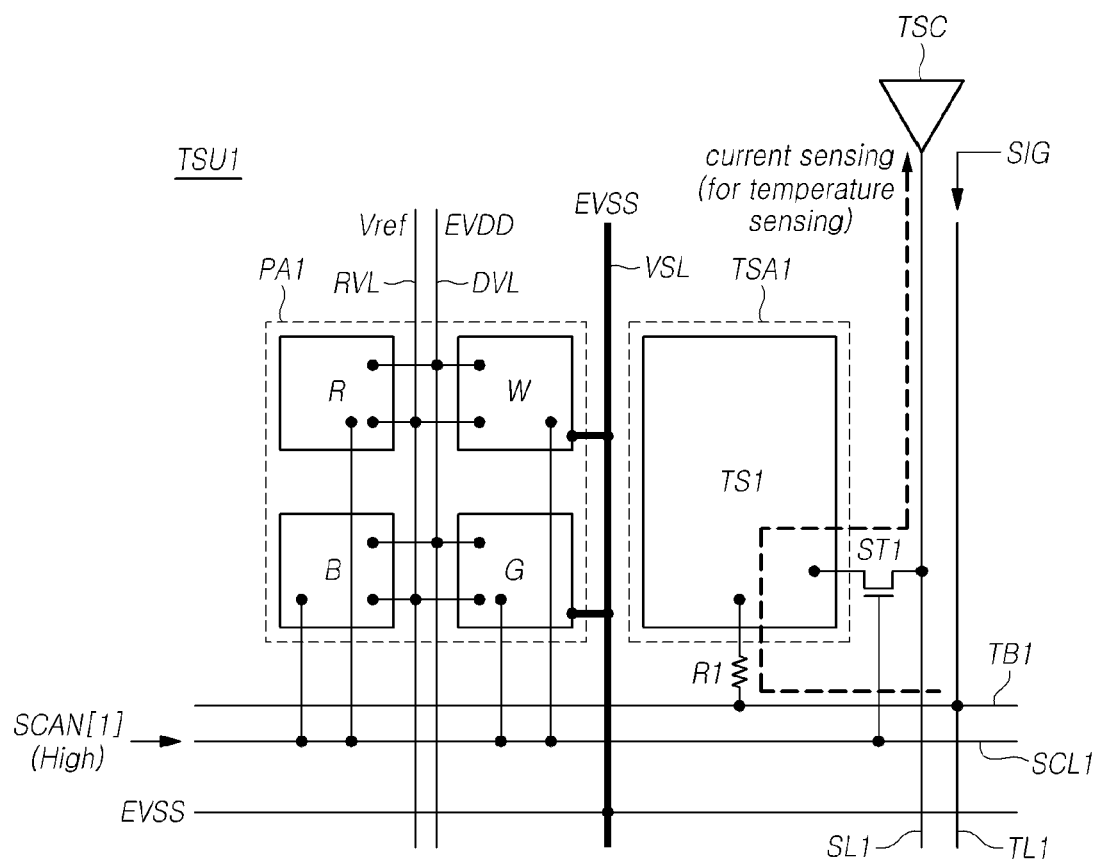
FIG. 10 is a view illustrating a first touch sensor unit area during a display period when temperature sensing proceeds in a touch display device according to exemplary embodiments of the disclosure.

FIG. 10 is a view illustrating a first touch sensor unit area TSU1 during a display period DP when temperature sensing proceeds in a touch display device 100 according to exemplary embodiments of the disclosure.

Referring to FIG. 10, the touch display device 100 according to exemplary embodiments of the disclosure may further include a current sensing circuit TSC connected to the first sensing line SL1 to sense a current flowing through the first sensing line SL1.

Referring to FIG. 10, during the display period DP, the first scanning gate signal SCAN[1] may have a turn-on level voltage for a predetermined time (e.g., 1 horizontal time or 2 horizontal times, without being limited thereto). Here, as illustrated in FIG. 10, when the first sensing transistor ST1 is an n-type transistor, the turn-on level voltage of the first scanning gate signal SCAN[1] may be a high level voltage. When the first sensing transistor ST1 is a p-type transistor, the turn-on level voltage of the first scanning gate signal SCAN[1] may be a low level voltage.

Referring to FIG. 10, during the display period DP, when the first scanning gate signal SCAN[1] has a turn-on level voltage, the first sensing transistor ST1 may be turned on. In this case, the scanning transistors SCT in the subpixels R, W, B, and G in the first pixel area PA1 may also be turned on.

Referring to FIG. 10, as the first sensing transistor ST1 is turned on for temperature sensing during the display period DP, the first touch sensor TS1 and the first sensing line SL1 may be electrically connected to each other through the first sensing transistor ST1.

During the entire display period DP, temperature sensing may be performed. Alternatively, temperature sensing may be performed during a portion of the display period DP.

Referring to FIG. 10, a test signal SIG for temperature sensing may be supplied to the first touch line TL1 during the display period DP. For example, during the display period DP, the test signal SIG supplied to the first touch line TL1 for temperature sensing may be a voltage having a constant first voltage level or a voltage having a variable voltage level.

Referring to FIG. 10, when a test signal SIG is supplied to a first touch line TL1 for temperature sensing during a display period DP, no signal may be applied to the first sensing line SL1 or a voltage having a constant second voltage level may be applied. Here, the second voltage level may be different from the first voltage level. For example, the second voltage level may be a voltage level lower than the first voltage level. Alternatively, the second voltage level may be a voltage level higher than the first voltage level.

During the display period DP, as the first sensing transistor ST1 is turned on, the first touch sensor TS1 and the first sensing line SL1 are electrically connected to each other, and the test signal SIG is applied to the first touch line TL1 connected to the first touch sensor TS1, a current may flow through the first sensing line SL1. Here, the path through which the current flows may include a first touch line TL1, a first touch bridge line TB1, a first touch sensor TS1, a first sensing transistor ST1, and a second sensing line SL1.

Referring to FIG. 10, during the display period DP, the current sensing circuit TSC connected to the first sensing line SL1 may sense the current flowing through the first sensing line SL1. For example, the current sensing circuit TSC may include an analog-to-digital converter. The analog-to-digital converter may convert a voltage corresponding to a current flowing through the first sensing line SL1 into a digital value and output the digital value as a current sensing value.

In other words, during the display period DP, the first sensing transistor ST1 may be turned on. During a period when the first sensing transistor ST1 is turned on, the touch driving circuit 160 may supply a test signal SIG to the first touch line TL1, and the current sensing circuit TSC may sense the current flowing through the first sensing line SL1.

During the display period DP, the first scanning gate signal SCAN[1] supplied to the gate node of the first sensing transistor ST1 in the first touch sensor unit area TSU1 may be simultaneously supplied to the gate node of the scanning transistor SCT included in each of the subpixels R, W, B, and G disposed in the first pixel area PA1 in the first touch sensor unit area TSU1.

Accordingly, when current sensing is performed through the first sensing transistor ST1 in the first touch sensor unit area TSU1 during the display period DP, display driving of the subpixels R, W, B, and G disposed in the first pixel area PA1 in the first touch sensor unit area TSU1 may be performed. Here, the display driving may include supplying the data voltage Vdata for image displaying to the subpixels R, W, B, and G.

Referring to FIG. 10, as the temperature of the first touch sensor area TSA1 increases during the display period DP, the amount of current flowing through the first sensing line SL1 per unit time may increase.

During the display period DP, as the temperature of the first touch sensor area TSA1 increases, the mobility of the first sensing transistor ST1 may increase, and accordingly, the amount of current flowing through the first sensing line SL1 per unit time may increase.

During the display period DP, as the temperature of the first touch sensor area TSA1 decreases, the amount of current flowing through the first sensing line SL1 per unit time may decrease.

During the display period DP, as the temperature of the first touch sensor area TSA1 decreases, the mobility of the first sensing transistor ST1 may decrease, and accordingly, the amount of current flowing through the first sensing line SL1 per unit time may decrease.

In order to increase the accuracy of temperature sensing, the first sensing transistor ST1 may be a transistor having a characteristic in which a mobility change is large with respect to a temperature change. As an example, the first sensing transistor ST1 may be a transistor having a characteristic change sensitive to a temperature change.

For example, the first sensing transistor ST1 may be an oxide transistor having an active layer formed of an oxide semiconductor material. Embodiments are not limited thereto. As an example, the first sensing transistor ST1 may also be a transistor having an active layer formed of other semiconductor material, such as Si and GaAs, etc.

The temperature change in the first touch sensor area TSA1 may be caused by a touch by a finger around the first touch sensor area TSA1 or in the first touch sensor area TSA1, or may occur when an image displayed in relation to the first pixel area PA1 changes, without being limited thereto.

During the display period DP, when a touch by a finger occurs in or around the first touch sensor area TSA1, or when the grayscale of the image displayed in relation to the first pixel area PA1 increases, the amount of current flowing through the first sensing line SL1 may increase.

The increase in current by finger touch is described in more detail.

When a touch by a finger occurs in or around the first touch sensor area TSA1 in the first touch sensor unit area TSU1, the display panel 110 may be affected by the temperature of the finger, and thus the temperature of the first touch sensor unit area TSU1 may increase. Accordingly, the mobility of the first sensing transistor ST1 in the first touch sensor unit area TSU1 may increase, and thus the amount of current flowing per unit time through the first sensing transistor ST1 may increase.

The current increase due to the image change is described in more detail.

When the image displayed in relation to the first pixel area PA1 in the first touch sensor unit area TSU1 changes, the temperature in the first touch sensor unit area TSU1 may change.

For example, when the image displayed in relation to the first pixel area PA1 in the first touch sensor unit area TSU1 changes from a low grayscale image (e.g., a black image) to a high grayscale image (e.g., a white image), the temperature in the first touch sensor unit area TSU1 may increase. Accordingly, the mobility of the first sensing transistor ST1 in the first touch sensor unit area TSU1 may increase, and thus the amount of current flowing through the first sensing transistor ST1 per unit time may increase.

As the amount of current flowing through the first sensing line SL1 per unit time changes during the display period DP, the touch sensing value obtained during the touch period TP after the display period DP may be changed.

Figure 11:
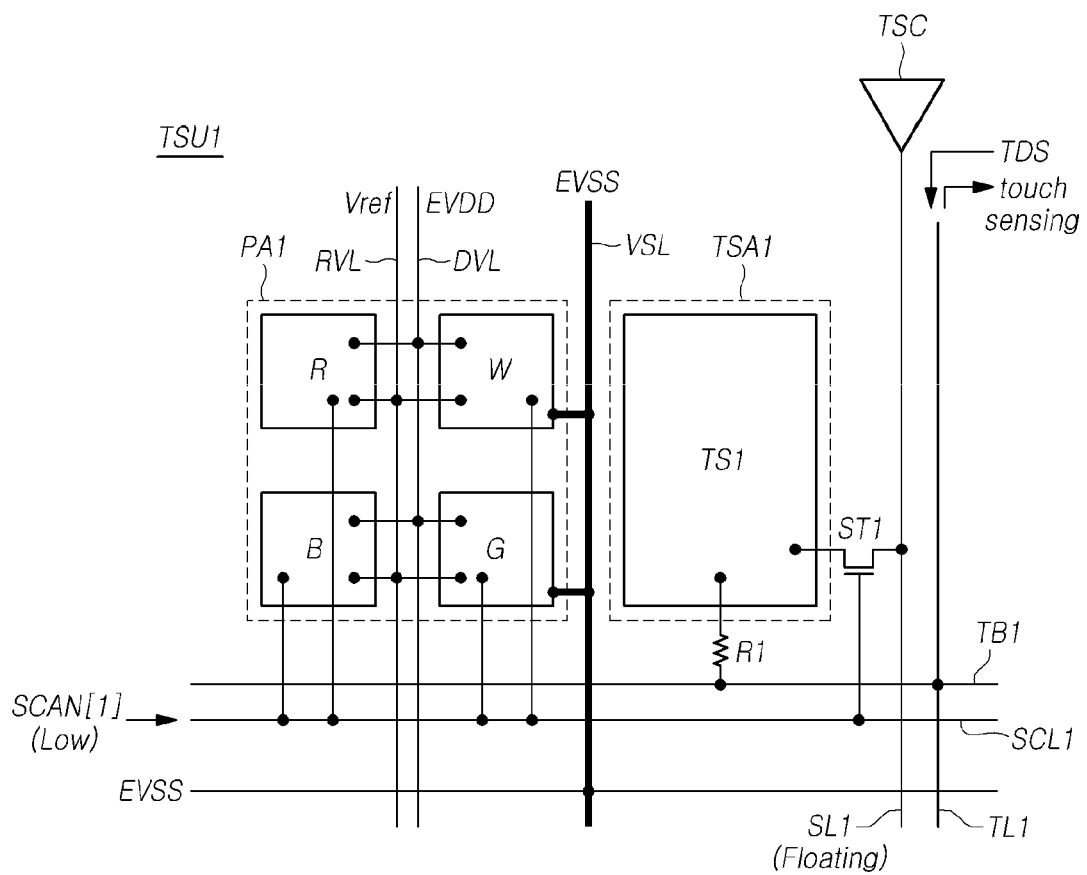
FIG. 11 is a view illustrating a first touch sensor unit area during a touch period in a touch display device according to exemplary embodiments of the disclosure.

FIG. 11 is a view illustrating a first touch sensor unit area TSU1 during a touch period TP in a touch display device 100 according to exemplary embodiments of the disclosure.

Referring to FIG. 11, during a touch period TP for touch sensing, the first scanning gate signal SCAN[1] may have a turn-off level voltage. Here, as illustrated in FIG. 11, when the first sensing transistor ST1 is an n-type transistor, the turn-off level voltage of the first scanning gate signal SCAN[1] may be a low level voltage. When the first sensing transistor ST1 is a p-type transistor, the turn-off level voltage of the first scanning gate signal SCAN[1] may be a high level voltage.

Referring to FIG. 11, as the first scanning gate signal SCAN[1] has a turn-off level voltage during the touch period TP for touch sensing, the first sensing transistor ST1 may be turned off, and the scanning transistors SCT included in the subpixels R, W, B, and B in the first pixel area PA1 may also be turned off.

Referring to FIG. 11, as the first sensing transistor ST1 is turned off during the touch period TP, the first touch sensor TS1 and the first sensing line SL1 may be electrically separated from each other.

During the touch period TP, a touch driving signal TDS having a variable voltage level may be supplied to the first touch line TL1.

During the touch period TP, the touch driving circuit 160 may supply the touch driving signal TDS to the first touch sensor TS1 through the first touch line TL1.

During the touch period TP, because the first touch sensor TS1 and the first sensing line SL1 are electrically separated by the turn-off of the first sensing transistor ST1, the touch driving signal TDS supplied to the first touch sensor TS1 is not transferred to the first sensing line SL1.

During the touch period TP, after outputting the touch driving signal TDS to the first touch line TL1, the touch driving circuit 160 may sense the capacitance (self-capacitance) of the first touch sensor TS1 through the first touch line TL1.

During the touch period TP, since the first sensing transistor ST1 is in a turned-off state, the first sensing line SL1 may be electrically separated from the first touch sensor TS1 and may be in an electrically floating state. Accordingly, a current may not flow through the first sensing line SL1 during the touch period TP. Accordingly, the first sensing line SL1 does not affect touch sensing.

Figure 12:
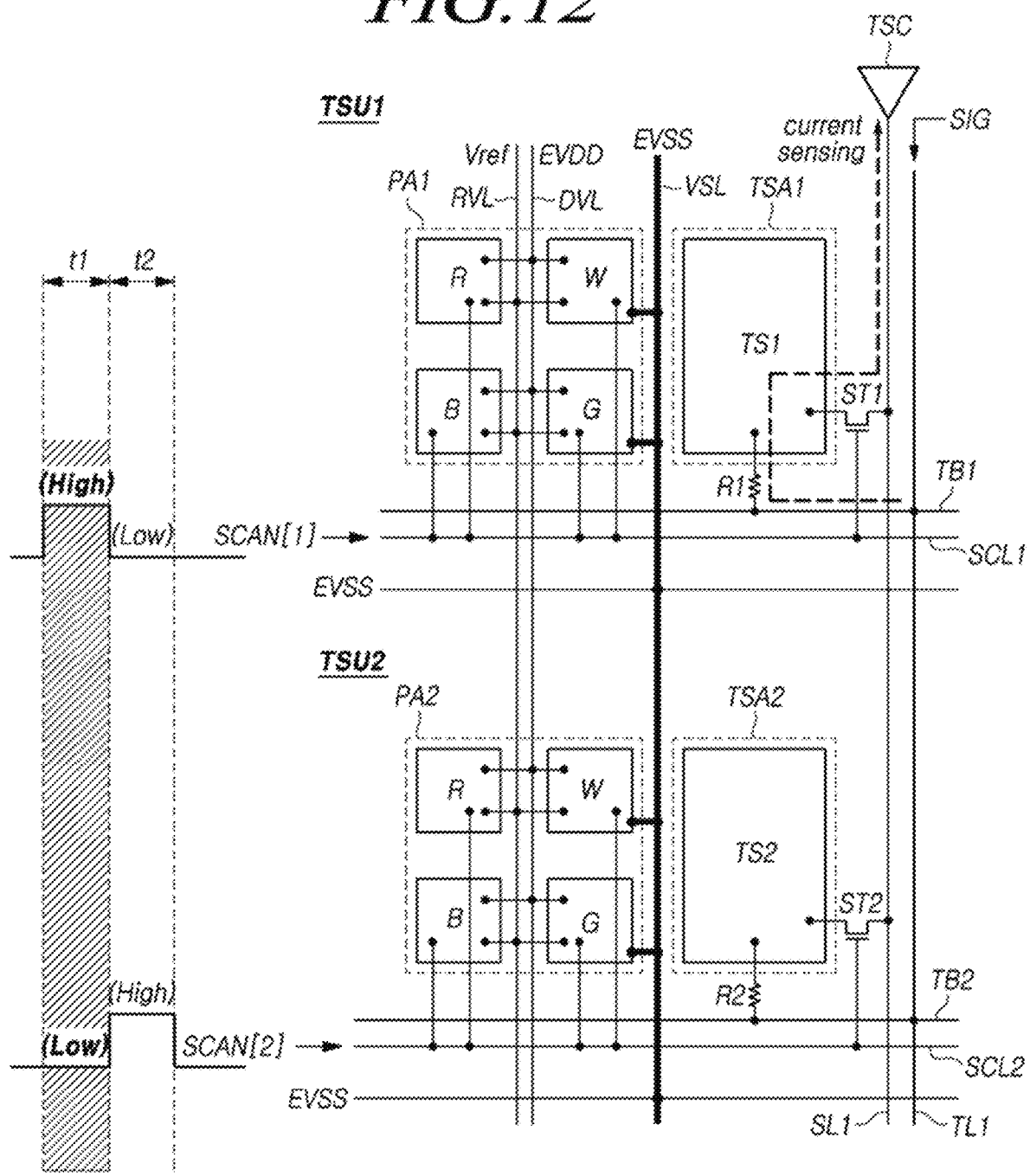
FIG. 12 is a view illustrating two touch sensor unit areas during a display period when temperature sensing proceeds in a touch display device according to exemplary embodiments of the disclosure.

FIG. 12 is a view illustrating two touch sensor unit areas TSU1 and TSU2 during a display period DP when temperature sensing proceeds in a touch display device 100 according to exemplary embodiments of the disclosure.

Referring to FIG. 12, the touch display device 100 may include a first touch sensor unit area TSU1 and a second touch sensor unit area TSU2.

The first touch sensor unit area TSU1 may include a first pixel area PA1 and a first touch sensor area TSA1. The first subpixels R, W, B, and G may be disposed in the first pixel area PA1, and the first touch sensor TS1 may be disposed in the first touch sensor area TSA1. The first touch sensor area TSA1 may be positioned on one side of the first pixel area PA1.

The second touch sensor unit area TSU2 may include a second pixel area PA2 and a second touch sensor area TSA2. The second subpixels R, W, B, and G may be disposed in the second pixel area PA2, and the second touch sensor TS2 may be disposed in the second touch sensor area TSA2. The second touch sensor area TSA2 may be positioned on one side of the second pixel area PA2. As an example, the one side of the first pixel area PA1 and the one side of the second pixel area PA2 may be the same side.

The second touch sensor unit area TSU2 may be adjacent to the first touch sensor unit area TSU1 in the column direction. The second pixel area PA2 may be adjacent to the first pixel area PA1 in the column direction. The second touch sensor area TSA2 may be adjacent to the first touch sensor area TSA1 in the column direction.

For display driving (pixel driving), the first driving power line DVL, the second driving power line VSL, and the reference voltage line RVL may be disposed in the column direction. The first driving power line DVL, the second driving power line VSL, and the reference voltage line RVL may be disposed across the first touch sensor unit area TSU1 and the second touch sensor unit area TSU2.

For display driving and temperature sensing, the first scanning gate line SCL1 may be disposed in the first touch sensor unit area TSU1, and the second scanning gate line SCL2 may be disposed in the second touch sensor unit area TSU2.

The first scanning gate line SCL1 may supply the first scanning gate signal SCAN[1] to the scanning transistor SCT in the first subpixels R, W, B, and G included in the first pixel area PA1 in the first touch sensor unit area TSU1.

The second scanning gate line SCL2 may supply the second scanning gate signal SCAN[2] to the scanning transistor SCT in the second subpixels R, W, B, and G included in the second pixel area PA2 in the second touch sensor unit area TSU2.

The first touch line TL1 and the first sensing line SL1 may be disposed in the column direction.

In the first touch sensor unit area TSU1, a first touch bridge line TB1 connecting the first touch line TL1 and the first touch sensor TS1 may be disposed.

A first sensing resistor R1 connected between the first touch sensor TS1 and the first touch bridge line TB1 may be disposed in the first touch sensor unit area TSU1.

In the second touch sensor unit area TSU2, a second touch bridge line TB2 connecting the first touch line TL1 and the second touch sensor TS2 may be disposed.

In the second touch sensor unit area TSU2, a second sensing resistor R2 connected between the second touch sensor TS2 and the second touch bridge line TB2 may be disposed. The second sensing resistor R2 may be a resistor connected between the second touch bridge line TB2 and the second touch sensor TS2. Alternatively, the second sensing resistor R2 may be a resistor connected between an extension of the second touch bridge line TB2 and the second touch sensor TS2. Alternatively, the second sensing resistor R2 may be an extension of the second touch bridge line TB2. Alternatively, the second sensing resistor R2 may be a resistor present in the second touch bridge line TB2, or may be a resistance component of the second touch bridge line TB2 or an extension thereof.

A first sensing transistor ST1 for controlling an electrical connection between the first sensing line SL1 and the first touch sensor TS1 may be disposed in the first touch sensor unit area TSU1.

A second sensing transistor ST2 for controlling an electrical connection between the first sensing line SL1 and the second touch sensor TS2 may be disposed in the second touch sensor unit area TSU2.

During the display driving period DP, the test signal SIG may be supplied to the first touch line TL1.

Referring to FIG. 12, during a first time t1 included in the display driving period DP, the first scanning gate signal SCAN[1] may have a turn-on level voltage High, and the second scanning gate signal SCAN[2] may have a turn-off level voltage Low, without being limited thereto.

Accordingly, during the first time t1, the first sensing transistor ST1 may be turned on, and the second sensing transistor ST2 may be turned off.

Accordingly, during the first time t1, a current for temperature sensing of the first touch sensor unit area TSU1 may flow along the first current flow path. The first current flow path may include a first touch line TL1, a first touch bridge line TB1, a first touch sensor TS1, a first sensing transistor ST1, and a first sensing line SL1.

During the first time t1, the current sensing circuit TSC may sense a current flowing along the first current flow path, generate a current sensing value for the first touch sensor unit area TSU1 according to a current sensing result, and supply the current sensing value to the touch controller 170.

The touch controller 170 may compensate for the touch sensing value based on the current sensing value for the first touch sensor unit area TSU1, for example, during the first time t1.

Referring to FIG. 12, the display driving period DP may include a first time t1 and a second time t2.

Referring to FIG. 12, during the second time t2 after the first time t1, the first scanning gate signal SCAN[1] may have the turn-off level voltage Low, and the second scanning gate signal SCAN[2] may have the turn-on level voltage High.

Accordingly, during the second time t2, the first sensing transistor ST1 may be turned off, and the second sensing transistor ST2 may be turned on.

Accordingly, during the second time t2, a current for temperature sensing of the second touch sensor unit area TSU2 may flow along the second current flow path. The second current flow path may include a first touch line TL1, a second touch bridge line TB2, a second touch sensor TS2, a second sensing transistor ST2, and a first sensing line SL1.

During the second time t2, the current sensing circuit TSC may sense a current flowing along the second current flow path, generate a current sensing value for the second touch sensor unit area TSU2 according to a current sensing result, and supply the current sensing value to the touch controller 170.

The touch controller 170 may compensate for the touch sensing value based on the current sensing value for the second touch sensor unit area TSU2, for example, during the second time t2 or after the second time t2.

Figure 13:
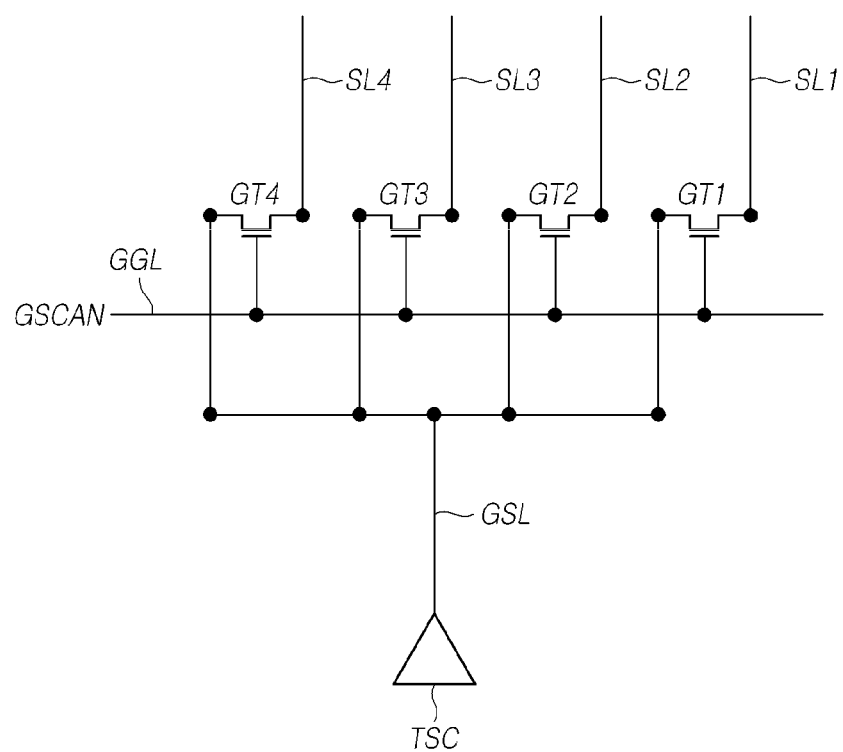
FIG. 13 is a view illustrating a structure for simultaneously performing temperature sensing on a plurality of touch sensors in a touch display device according to exemplary embodiments of the disclosure.

FIG. 13 is a view illustrating a structure for simultaneously performing temperature sensing on a plurality of touch sensors in a touch display device 100 according to exemplary embodiments of the disclosure.

Referring to FIG. 13, the touch display device 100 according to exemplary embodiments of the disclosure may simultaneously perform current sensing for temperature sensing in a plurality of touch sensor unit areas TSU.

To that end, the touch display device 100 according to exemplary embodiments of the disclosure may group two or more sensing lines SL1, SL2, SL3, and SL4 into one sensing line group and sensing them, thereby simultaneously sensing the temperature of the two or more touch sensor unit areas TSU. This sensing method is referred to as group sensing.

The group sensing structure of the touch display device 100 according to exemplary embodiments of the disclosure may include two or more grouped transistors GT1, GT2, GT3, and GT4, a grouped gate line GGL, and a group sensing line GSL.

The two or more grouped transistors GT1, GT2, GT3, and GT4 may correspond to the two or more sensing lines SL1, SL2, SL3, and SL4, respectively.

The grouped gate line GGL may be simultaneously connected to gate nodes of two or more grouped transistors GT1, GT2, GT3, and GT4.

By the grouped scanning signal GSCAN supplied from the grouped gate line GGL, the two or more grouped transistors GT1, GT2, GT3, and GT4 may be simultaneously turned on or off.

When the two or more grouped transistors GT1, GT2, GT3, and GT4 are turned on at the same time, the two or more sensing lines SL1, SL2, SL3, and SL4 may be electrically connected to one group sensing line GSL at the same time.

Currents flowing through two or more sensing lines SL1, SL2, SL3, and SL4 may be combined to flow through one group sensing line GSL. Accordingly, the current sensing circuit TSC may sense a summated current flowing through one group sensing line GSL.

The current sensing value may correspond to the temperature of the two or more touch sensor unit areas TSU corresponding to the two or more sensing lines SL1, SL2, SL3, and SL4.

The above-described group sensing may be a very effective and rapid sensing method when the contact area between the touch pointer (e.g., a finger or a pen) and the display panel 110 is small.

When the two or more grouped transistors GT1, GT2, GT3, and GT4 are turned off at the same time, the two or more sensing lines SL1, SL2, SL3, and SL4 may be electrically separated from one group sensing line GSL at the same time.

The two or more sensing lines SL1, SL2, SL3, and SL4 may be electrically connected to one group sensing line GSL through the two or more grouped transistors GT1, GT2, GT3, and GT4.

Figure 14:
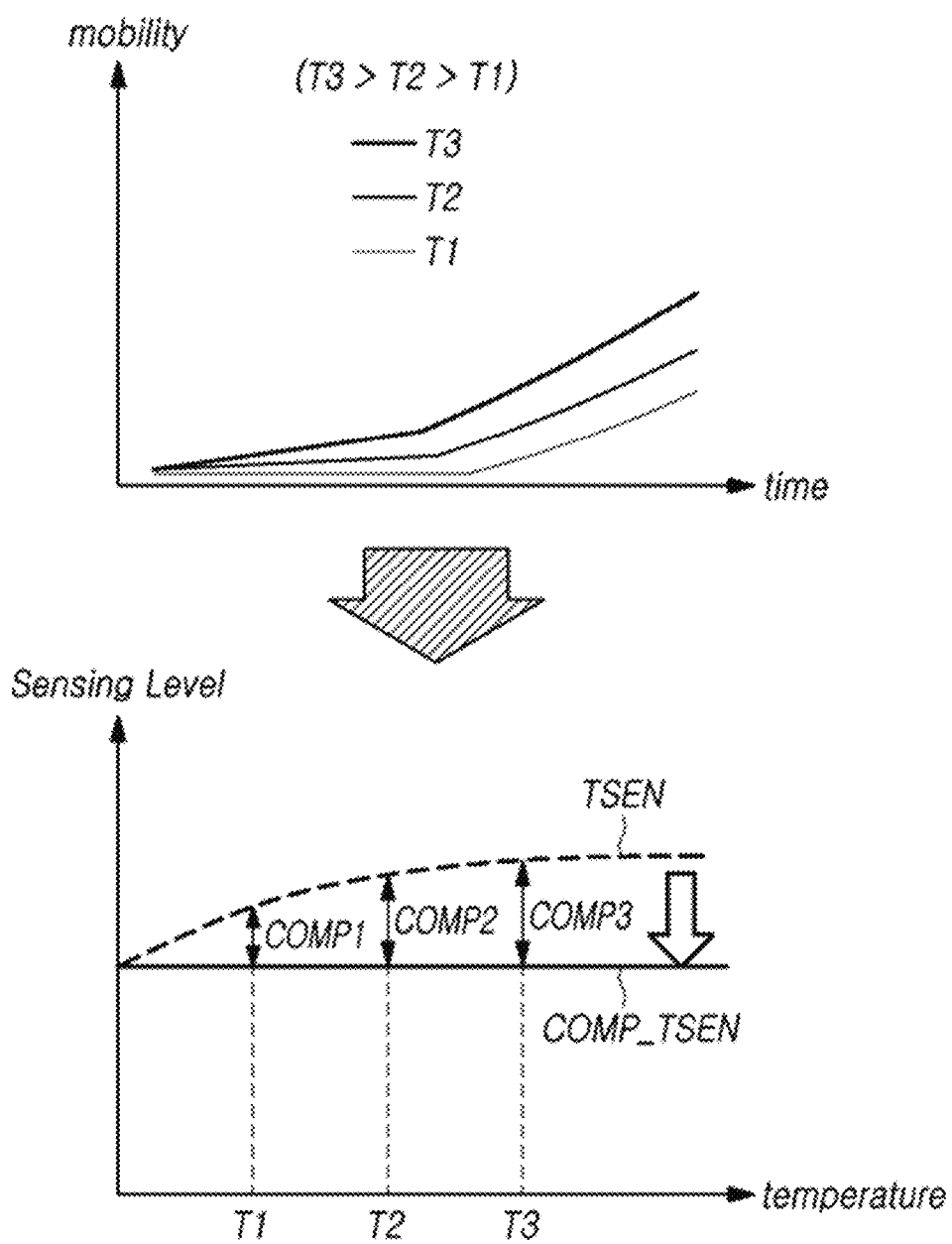
FIG. 14 is a view illustrating processing of compensating for a change in touch sensitivity due to a temperature change in a touch display device according to exemplary embodiments of the disclosure.

FIG. 14 is a view illustrating processing of compensating for a change in touch sensitivity due to a temperature change in a touch display device 100 according to exemplary embodiments of the disclosure.

FIG. 14 illustrates a graph (hereinafter, referred to as a mobility graph) indicating a change in mobility of a first sensing transistor ST1 over time, and a graph (hereinafter, referred to as a touch sensing value graph) indicating a touch sensing value and a compensated touch sensing value according to temperature.

Referring to FIG. 14, the mobility graph shows a change in mobility of the first sensing transistor ST1 over time for each of the three temperatures T1, T2, and T3. Here, among the first temperature T1, the second temperature T2, and the third temperature T3, the third temperature T3 may be the highest temperature, and the first temperature T1 may be the lowest temperature. In other words, the third temperature T3>the second temperature T2>the first temperature T1.

Referring to FIG. 14, at the same time, as the temperature increases, the mobility may increase. In other words, at the third temperature T3, the mobility of the first sensing transistor ST1 may have the largest third mobility value, at the first temperature T1, the mobility of the first sensing transistor ST1 may have the smallest first mobility value, and at the second temperature T2, the mobility of the first sensing transistor ST1 may have the second mobility value between the first mobility value and the third mobility value.

Accordingly, as a result of current sensing for temperature sensing during the display period DP, the current sensing circuit TSC may obtain the third current sensing value, which is the largest, at the third temperature T3, may obtain the first current sensing value, which is the smallest, at the first temperature T1, and may obtain the second current sensing value between the first current sensing value and the third current sensing value at the second temperature T2.

The touch display device 100 according to exemplary embodiments of the disclosure may further include a memory storing a lookup table including a compensation value corresponding to each current sensing value. Embodiments are not limited thereto. As an example, the memory storing the lookup table may also be disposed outside the touch display device 100.

For example, as a result of performing temperature sensing (current sensing) during the display period DP, when the touch controller 170 receives the first current sensing value from the current sensing circuit TSC and then receives the first touch sensing value TSEN from the touch driving circuit 160 during the touch period TP, the touch controller 170 may change the first touch sensing value TSEN using the first current sensing value to generate the second touch sensing value COMP_TSEN.

The second touch sensing value COMP_TSEN may be a value obtained by subtracting the first compensation value COMP1 corresponding to the first current sensing value from the first touch sensing value TSEN. Here, the first compensation value COMP1 is a compensation value extracted from the lookup table, and may be a compensation value corresponding to the first current sensing value.

The touch controller 170 may extract a first compensation value COMP1 corresponding to the first current sensing value received from the current sensing circuit TSC from the lookup table. The second touch sensing value COMP_TSEN may be a touch sensing value produced by removing temperature influencing from the first touch sensing value TSEN.

As another example, as a result of performing temperature sensing (current sensing) during the display period DP, when the touch controller 170 receives the second current sensing value from the current sensing circuit TSC and then receives the first touch sensing value TSEN from the touch driving circuit 160 during the touch period TP, the touch controller 170 may change the first touch sensing value TSEN using the second current sensing value to generate the second touch sensing value COMP_TSEN.

The second touch sensing value COMP_TSEN may be a value obtained by subtracting the second compensation value COMP2 corresponding to the second current sensing value from the first touch sensing value TSEN. Here, the second compensation value COMP2 is a compensation value extracted from the lookup table, and may be a compensation value corresponding to the second current sensing value.

The touch controller 170 may extract the second compensation value COMP2 corresponding to the second current sensing value received from the current sensing circuit TSC from the lookup table. The second touch sensing value COMP_TSEN may be a touch sensing value produced by removing temperature influencing from the first touch sensing value TSEN.

As another example, as a result of performing temperature sensing (current sensing) during the display period DP, when the touch controller 170 receives the third current sensing value from the current sensing circuit TSC and then receives the first touch sensing value TSEN from the touch driving circuit 160 during the touch period TP, the touch controller 170 may change the first touch sensing value TSEN using the third current sensing value to generate the second touch sensing value COMP_TSEN.

The second touch sensing value COMP_TSEN may be a value obtained by subtracting the third compensation value COMP3 corresponding to the third current sensing value from the first touch sensing value TSEN. Here, the third compensation value COMP3 is a compensation value extracted from the lookup table, and may be a compensation value corresponding to the third current sensing value.

The touch controller 170 may extract the third compensation value COMP3 corresponding to the third current sensing value received from the current sensing circuit TSC from the lookup table. The second touch sensing value COMP_TSEN may be a touch sensing value produced by removing temperature influencing from the first touch sensing value TSEN.

The first driving method in which the first sensing line SL1 becomes a current sensing path of the two driving methods has been described above, and the second driving method in which the first touch line TL1 becomes a current sensing path is described below. Hereinafter, descriptions of the same features as the first driving method will be omitted or briefly given.

Figure 15:
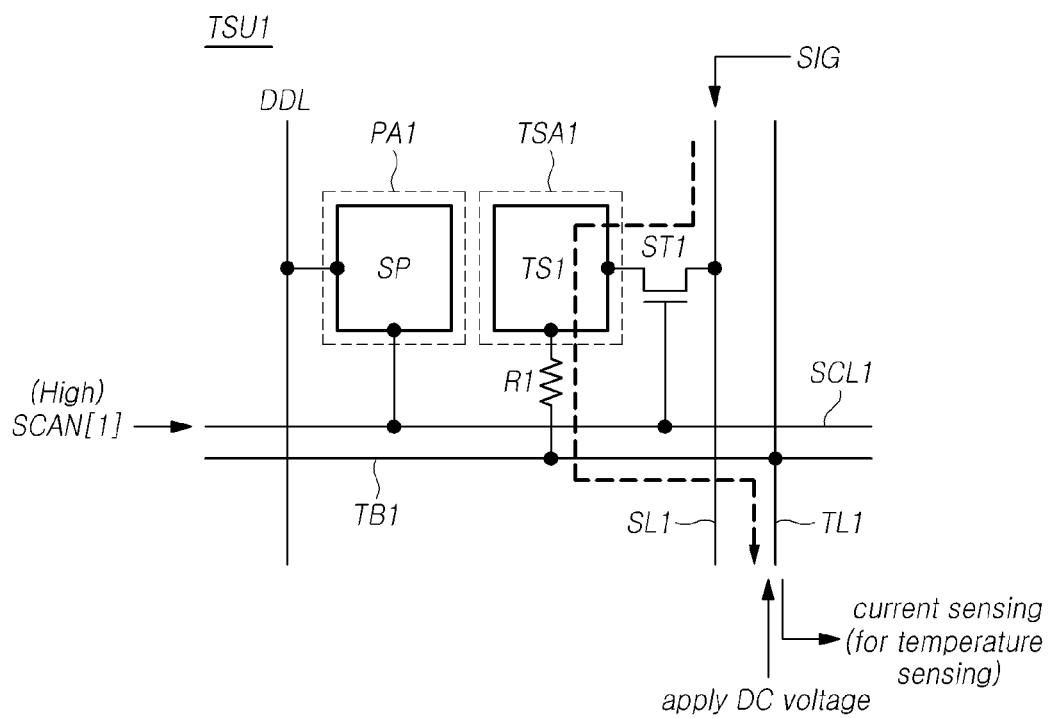
FIG. 15 is a view illustrating a first touch sensor unit area during a display period when temperature sensing proceeds in a touch display device according to exemplary embodiments of the disclosure.

FIG. 15 is a view illustrating a first touch sensor unit area TSU1 during a display period DP when temperature sensing proceeds in a touch display device 100 according to exemplary embodiments of the disclosure.

Referring to FIG. 15, for a predetermined time during the display period DP, the first scanning gate signal SCAN[1] supplied through the first scanning gate line SCL1 may have a turn-on level voltage (e.g., a high level voltage). Accordingly, the scanning transistor SCT of the first subpixel SP1 in the first pixel area PA1 may be turned on, and at the same time, the first sensing transistor ST1 may be turned on.

Referring to FIG. 15, as the first sensing transistor ST1 is turned on during the display period DP, the first touch sensor TS1 and the first sensing line SL1 may be electrically connected to each other through the first sensing transistor ST1.

Referring to FIG. 15, a test signal SIG may be supplied to the first sensing line SL1, e.g., during the display period DP.

Referring to FIG. 15, during a period when the first sensing transistor ST1 is turned on, a test signal SIG may be supplied to the first sensing line SL1.

For example, during the display period DP, the test signal SIG supplied to the first sensing line SL1 for temperature sensing may be a voltage (DC voltage) having a constant first voltage level or a voltage (AC voltage) having a variable voltage level.

Referring to FIG. 15, when the test signal SIG is supplied to the first sensing line SL1 for temperature sensing during the display period DP, the voltage DC having the predetermined second voltage level may be applied to the first touch line TL1. Here, the second voltage level may be different from the first voltage level. For example, the second voltage level may be a voltage level lower than the first voltage level. Alternatively, the second voltage level may be a voltage level higher than the first voltage level.

Referring to FIG. 15, a current may flow through the first touch line TL1 during the display period DP. The touch driving circuit 160 may sense the current flowing through the first touch line TL1, and may include the current sensing circuit TSC connected to the first touch line TL1. In the case of the second driving method, the current sensing circuit TSC connected to the first sensing line SL1 may have a function of supplying the test signal SIG to the first sensing line SL1 instead of the current sensing function.

Referring to FIG. 15, during the display period DP, as the temperature of the first touch sensor area TSA1 increases, the amount of current flowing through the first touch line TL1 may increase, and as the temperature of the first touch sensor area TSA1 decreases, the amount of current flowing through the first touch line TL1 may decrease.

During the display period DP, when a touch occurs in or around the first touch sensor area TSA1, or when an image displayed in relation to the first pixel area PA1 changes, the amount of current flowing through the first touch line TL1 may increase.

As the amount of current flowing through the first touch line TL1 changes during the display period DP, the touch sensing value obtained during the touch period TP after the display period DP may be changed (see FIG. 14 and the description thereof).

Figure 16:
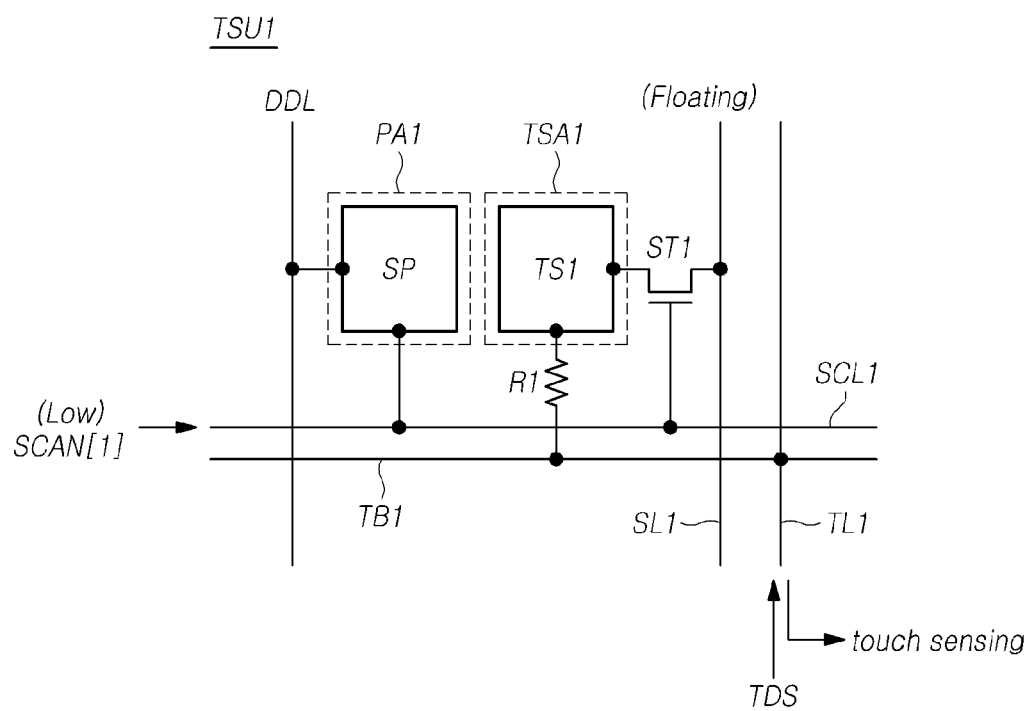
FIG. 16 is a view illustrating a first touch sensor unit area during a touch period in a touch display device according to exemplary embodiments of the disclosure.

FIG. 16 is a view illustrating a first touch sensor unit area TSU1 during a touch period TP in a touch display device 100 according to exemplary embodiments of the disclosure.

Referring to FIG. 16, as the first sensing transistor ST1 is turned off during the touch period TP, the first touch sensor TS1 and the first sensing line SL1 may be electrically separated from each other.

During the touch period TP, the touch driving signal TDS whose voltage level is varied may be supplied to the first touch line TL1, and the first sensing line SL1 may be in an electrically floating state.

During the touch period TP, the touch driving circuit 160 may output a touch driving signal TDS having a variable voltage level to the first touch line TL1. Accordingly, the touch driving signal TDS may be supplied to the first touch sensor TS1 connected to the first touch line TL1.

During the touch period TP, because the first touch sensor TS1 and the first sensing line SL1 are electrically separated by the turn-off of the first sensing transistor ST1, the touch driving signal TDS supplied to the first touch sensor TS1 is not transferred to the first sensing line SL1. Accordingly, during the touch period TP, the first sensing line SL1 may be in an electrically floating state.

During the touch period TP, after outputting the touch driving signal TDS to the first touch line TL1, the touch driving circuit 160 may sense the capacitance (self-capacitance) of the first touch sensor TS1 through the first touch line TL1.

During the touch period TP, since the first sensing transistor ST1 is in a turned-off state, the first sensing line SL1 may be electrically separated from the first touch sensor TS1 and may be in an electrically floating state. Accordingly, during the touch period TP, the first sensing line SL1 does not affect touch sensing.

Figure 17A:
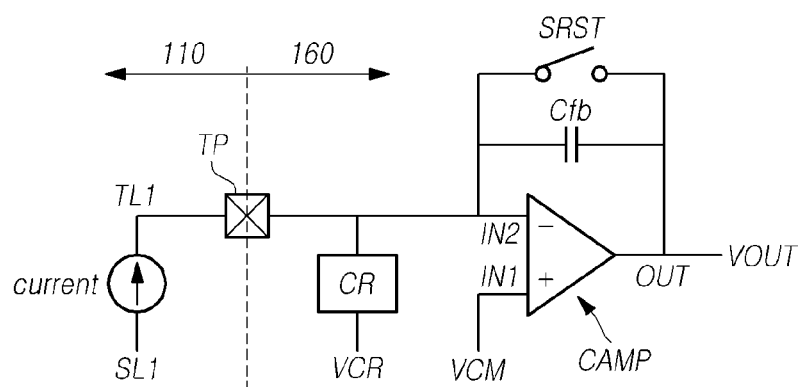
FIG. 17A is a view illustrating a touch driving circuit and a first temperature sensing operation state when temperature sensing proceeds during a display period in a touch display device according to exemplary embodiments of the disclosure.
Figure 17B:
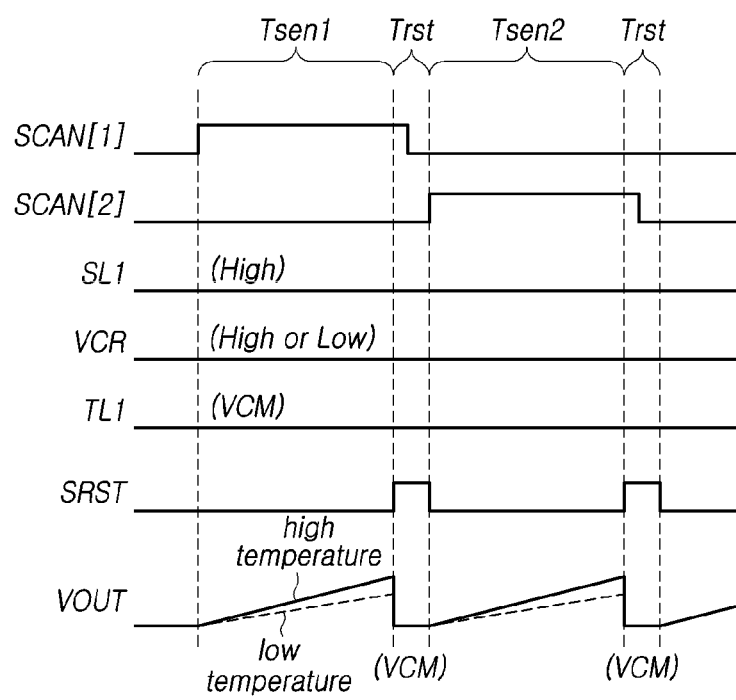
FIG. 17B is a driving timing diagram when temperature sensing proceeds according to the first temperature sensing operation state of FIG. 17A according to exemplary embodiments of the disclosure.
Figure 18A:
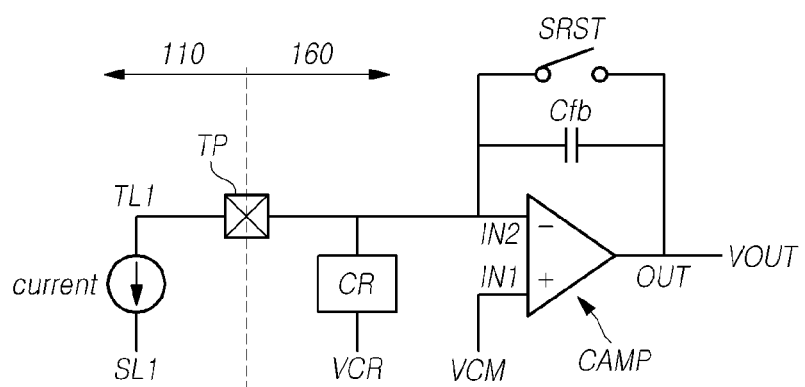
FIG. 18A is a view illustrating a touch driving circuit and a second temperature sensing operation state when temperature sensing proceeds during a display period in a touch display device according to exemplary embodiments of the disclosure.
Figure 18B:
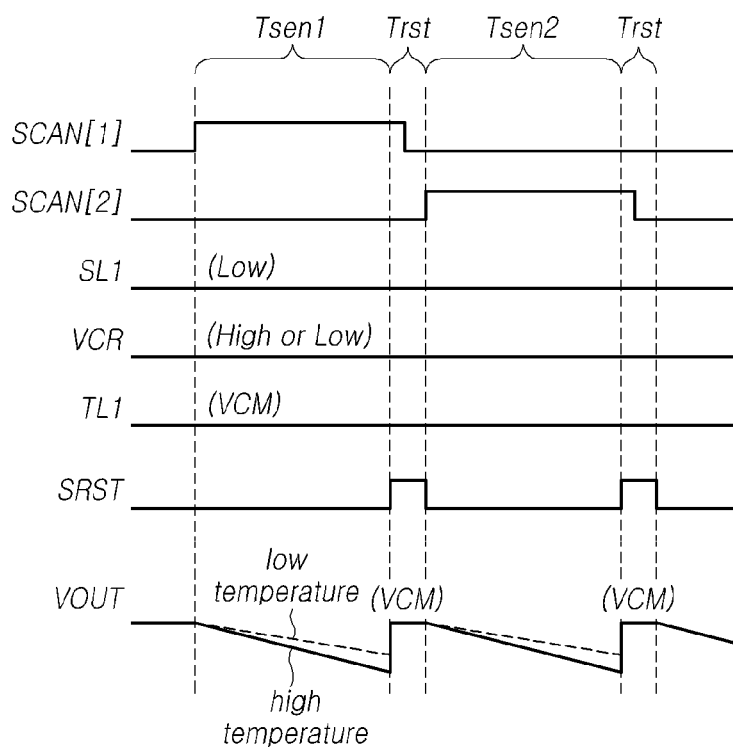
FIG. 18B is a driving timing diagram when temperature sensing proceeds according to the second temperature sensing operation state of FIG. 18A according to exemplary embodiments of the disclosure.

FIG. 17A is a view illustrating a touch driving circuit 160 and a first temperature sensing operation state when temperature sensing proceeds during a display period DP in a touch display device 100 according to exemplary embodiments of the disclosure. FIG. 17B is a driving timing diagram when temperature sensing (current sensing) proceeds according to the first temperature sensing operation state of FIG. 17A according to exemplary embodiments of the disclosure. FIG. 18A is a view illustrating a touch driving circuit 160 and a second temperature sensing operation state when temperature sensing proceeds during a display period DP in a touch display device 100 according to exemplary embodiments of the disclosure. FIG. 18B is a driving timing diagram when temperature sensing (current sensing) proceeds according to the second temperature sensing operation state of FIG. 18A according to exemplary embodiments of the disclosure.

Referring to FIGS. 17A, 17B, 18A, and 18B, temperature sensing may be performed through current sensing during a display period DP.

Referring to FIGS. 17A, 17B, 18A, and 18B, the display period DP may alternately include a plurality of temperature sensing periods Tsen1 and Tsen2 and a plurality of reset periods Trst.

Referring to FIGS. 17A, 17B, 18A, and 18B, the plurality of temperature sensing periods Tsen1 and Tsen2 may include a first temperature sensing period Tsen1 during which temperature sensing for the first touch sensor unit area TSU1 is performed, and a second temperature sensing period Tsen2 during which temperature sensing for the second touch sensor unit area TSU1 is performed.

The second touch sensor unit area TSU1 may be adjacent to the first touch sensor unit area TSU1 in the column direction (see FIG. 12).

The second temperature sensing period Tsen2 may be performed after the first temperature sensing period Tsen1. Here, the first temperature sensing period Tsen1 may correspond to the first time t1 of FIG. 12, and the second temperature sensing period Tsen2 may correspond to the second time t2 of FIG. 12 (see FIG. 12).

Referring to FIGS. 17A, 17B, 18A, and 18B, the plurality of reset periods Trst may include a reset period Trst between the first temperature sensing period Tsen1 and the second temperature sensing period Tsen2.

Referring to FIGS. 17A, 17B, 18A, and 18B, the reset switch SRST in the touch driving circuit 160 may be turned on in each of the plurality of reset periods Trst. The reset switch SRST in the touch driving circuit 160 may be turned off in each of a plurality of temperature sensing periods Tsen1 and Tsen2.

Referring to FIGS. 17A, 17B, 18A, and 18B, during the first temperature sensing period Tsen1 during which temperature sensing for the first touch sensor unit area TSU1 is performed, the first sensing transistor ST1 disposed in the first touch sensor unit area TSU1 may be turned on by the turn-on level voltage (e.g., the high level voltage) of the first scanning gate signal SCAN[1], and then may be turned off by the turn-off level voltage (e.g., the low level voltage) of the first scanning gate signal SCAN[1].

Referring to FIGS. 17A, 17B, 18A, and 18B, during the second temperature sensing period Tsen2 during which temperature sensing for the second touch sensor unit area TSU2 is performed, the second sensing transistor ST2 disposed in the second touch sensor unit area TSU2 may be turned on by the turn-on level voltage (e.g., the high level voltage) of the second scanning gate signal SCAN[2], and then may be turned off by the turn-off level voltage (e.g., the low level voltage) of the second scanning gate signal SCAN[2].

Referring to FIGS. 17A, 17B, 18A, and 18B, during the display period DP, a test signal SIG may be supplied to the first sensing line SL1, and a driving signal VCM having a constant voltage value may be applied to the first touch line TL1.

Referring to FIGS. 17A, 17B, 18A, and 18B, the test signal SIG supplied to the first sensing line SL1 during the display period DP may be a DC (direct current) voltage signal having a constant first voltage value.

Referring to FIGS. 17A, 17B, 18A, and 18B, during the display period DP, the driving signal VCM input to the first input terminal IN1 of the charge amplifier CAMP in the touch driving circuit 160 may be a DC voltage signal having a constant second voltage value.

Accordingly, during the display period DP, the driving signal VCM, which is the DC voltage signal having the second voltage value, may be output to the first touch line TL1 through the second input terminal IN2 of the charge amplifier CAMP in the touch driving circuit 160. In other words, during a period when temperature sensing is performed during the display period DP, the driving signal VCM supplied to the first touch line TL1 may be a DC (direct current) voltage signal having a constant second voltage value. The driving signal VCM output to the first touch line TL1 may be applied to the first touch sensor TS1 through the first touch bridge line TB1.

Referring to FIGS. 17A, 17B, 18A, and 18B, during the display period DP, the charge removal control signal VCR input to the charge removal circuit CR in the touch driving circuit 160 may have a high-level voltage or a low-level voltage Low.

Referring to FIGS. 17A and 17B, the test signal SIG supplied to the first sensing line SL1 during the display period DP may be a DC voltage signal having a constant first voltage value High. During the display period DP, a driving signal VCM corresponding to a DC voltage signal having a second voltage value Low lower than the first voltage value High may be supplied to the first touch line TL1.

Referring to FIGS. 17A and 17B, when the temperature sensing operation state of the touch display device 100 is a first temperature sensing operation state in which the first sensing line SL1 has a voltage state higher than that of the first touch line TL1, a current may flow from the first sensing line SL1 to the first touch line TL1. In this case, the flow path of the current flowing from the first sensing line SL1 to the first touch line TL1 may sequentially include the first sensing line SL1, the first sensing transistor ST1, the first touch sensor TS1, the first touch bridge line TB1, and the first touch line TL1.

Referring to FIGS. 17A and 17B, as the current flows from the first sensing line SL1 to the first touch line TL1 during the first temperature sensing period Tsen1 for the first touch sensor unit area TSU1, the feedback capacitor Cfb in the touch driving circuit 160 may be charged during the first temperature sensing period Tsen1.

Accordingly, during the first temperature sensing period Tsen1, the value of the output signal VOUT output from the output terminal OUT of the charge amplifier CAMP in the touch driving circuit 160 may increase over time.

In this case, as the temperature increases, the mobility of the first sensing transistor ST1 in the first touch sensor unit area TSU1 may increase. Accordingly, as the amount of current flowing from the first sensing line SL1 to the first touch line TL1 per unit time increases, the value of the output signal VOUT output from the output terminal OUT of the charge amplifier CAMP in the touch driving circuit 160 may increase more rapidly.

Referring to FIGS. 17A and 17B, when the reset period Trst is reached after the first temperature sensing period Tsen1, the reset switch SRST is turned on.

Accordingly, the output terminal OUT of the charge amplifier CAMP in the touch driving circuit 160 may be electrically connected to the second input terminal IN2, and accordingly, the output signal VOUT output from the output terminal OUT may be the same as the driving signal VCM input to the first input terminal IN1. Here, the first input terminal IN1 and the second input terminal IN2 of the charge amplifier CAMP may have the same electrical state.

Referring to FIGS. 17A and 17B, as the current flows from the first sensing line SL1 to the first touch line TL1 during the second temperature sensing period Tsen2 for the second touch sensor unit area TSU2, the feedback capacitor Cfb in the touch driving circuit 160 may be charged during the second temperature sensing period Tsen2.

Accordingly, during the second temperature sensing period Tsen2, the value of the output signal VOUT output from the output terminal OUT of the charge amplifier CAMP in the touch driving circuit 160 may increase over time.

In this case, as the temperature increases, the mobility of the second sensing transistor ST2 in the second touch sensor unit area TSU2 may increase. Accordingly, as the amount of current flowing from the first sensing line SL1 to the first touch line TL1 per unit time increases, the value of the output signal VOUT output from the output terminal OUT of the charge amplifier CAMP in the touch driving circuit 160 may increase more rapidly.

Referring to FIGS. 18A and 18B, the test signal SIG supplied to the first sensing line SL1 during the display period DP may be a DC voltage signal having a constant first voltage value Low. During the display period DP, a driving signal VCM corresponding to a DC voltage signal having a second voltage value High higher than the first voltage value Low may be supplied to the first touch line TL1.

Referring to FIGS. 18A and 18B, when the temperature sensing operation state of the touch display device 100 is the second temperature sensing operation state in which the first sensing line SL1 has a voltage state lower than that of the first touch line TL1, a current may flow from the first touch line TL1 to the first sensing line SL1. In this case, the flow path of the current flowing from the first touch line TL1 to the first sensing line SL1 may sequentially include the first touch line TL1, the first touch bridge line TB1, the first touch sensor TS1, the first sensing transistor ST1, and the first sensing line SL1.

Referring to FIGS. 18A and 18B, as the current flows from the first touch line TL1 to the first sensing line SL1 during the first temperature sensing period Tsen1 for the first touch sensor unit area TSU1, the feedback capacitor Cfb in the touch driving circuit 160 may be discharged during the first temperature sensing period Tsen1.

Accordingly, during the first temperature sensing period Tsen1, the value of the output signal VOUT output from the output terminal OUT of the charge amplifier CAMP in the touch driving circuit 160 may decrease over time.

In this case, as the temperature increases, the mobility of the first sensing transistor ST1 in the first touch sensor unit area TSU1 may increase. Accordingly, as the amount of current flowing from the first touch line TL1 to the first sensing line SL1 per unit time increases, the value of the output signal VOUT output from the output terminal OUT of the charge amplifier CAMP in the touch driving circuit 160 may decrease more rapidly.

Referring to FIGS. 18A and 18B, when the reset period Trst is reached after the first temperature sensing period Tsen1, the reset switch SRST is turned on.

Accordingly, the output terminal OUT of the charge amplifier CAMP in the touch driving circuit 160 may be electrically connected to the second input terminal IN2, and accordingly, the output signal VOUT output from the output terminal OUT may be the same as the driving signal VCM input to the first input terminal IN1. Here, the first input terminal IN1 and the second input terminal IN2 of the charge amplifier CAMP may have the same electrical state.

Referring to FIGS. 18A and 18B, as the current flows from the first touch line TL1 to the first sensing line SL1 during the second temperature sensing period Tsen2 for the second touch sensor unit area TSU2, the feedback capacitor Cfb in the touch driving circuit 160 may be discharged again during the second temperature sensing period Tsen2.

Accordingly, during the second temperature sensing period Tsen2, the value of the output signal VOUT output from the output terminal OUT of the charge amplifier CAMP in the touch driving circuit 160 may decrease over time.

In this case, as the temperature increases, the mobility of the second sensing transistor ST2 in the second touch sensor unit area TSU2 may increase. Accordingly, as the amount of current flowing from the first touch line TL1 to the first sensing line SL1 per unit time increases, the value of the output signal VOUT output from the output terminal OUT of the charge amplifier CAMP in the touch driving circuit 160 may decrease more rapidly.

Figure 19A:
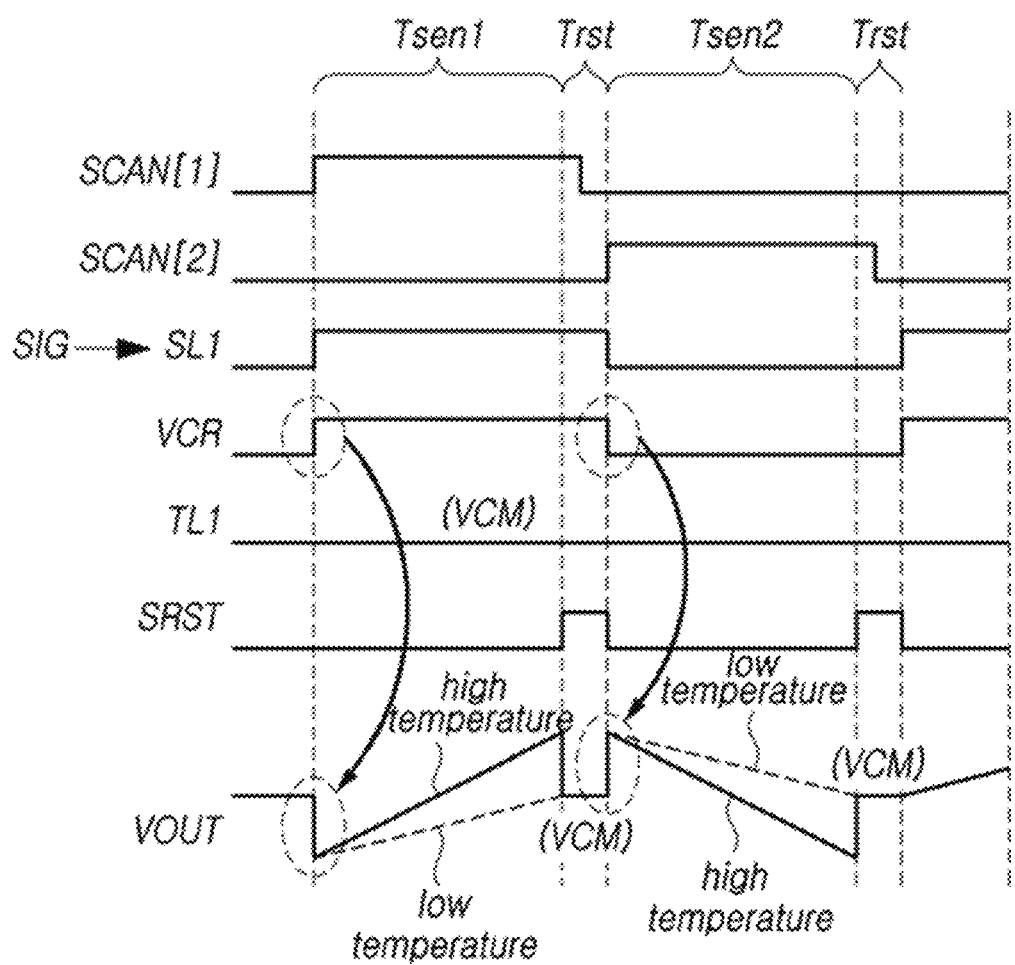
FIG. 19A is a timing diagram when temperature sensing proceeds according to a third temperature sensing operation state during a display period in a touch display device according to exemplary embodiments of the disclosure.
Figure 19B:
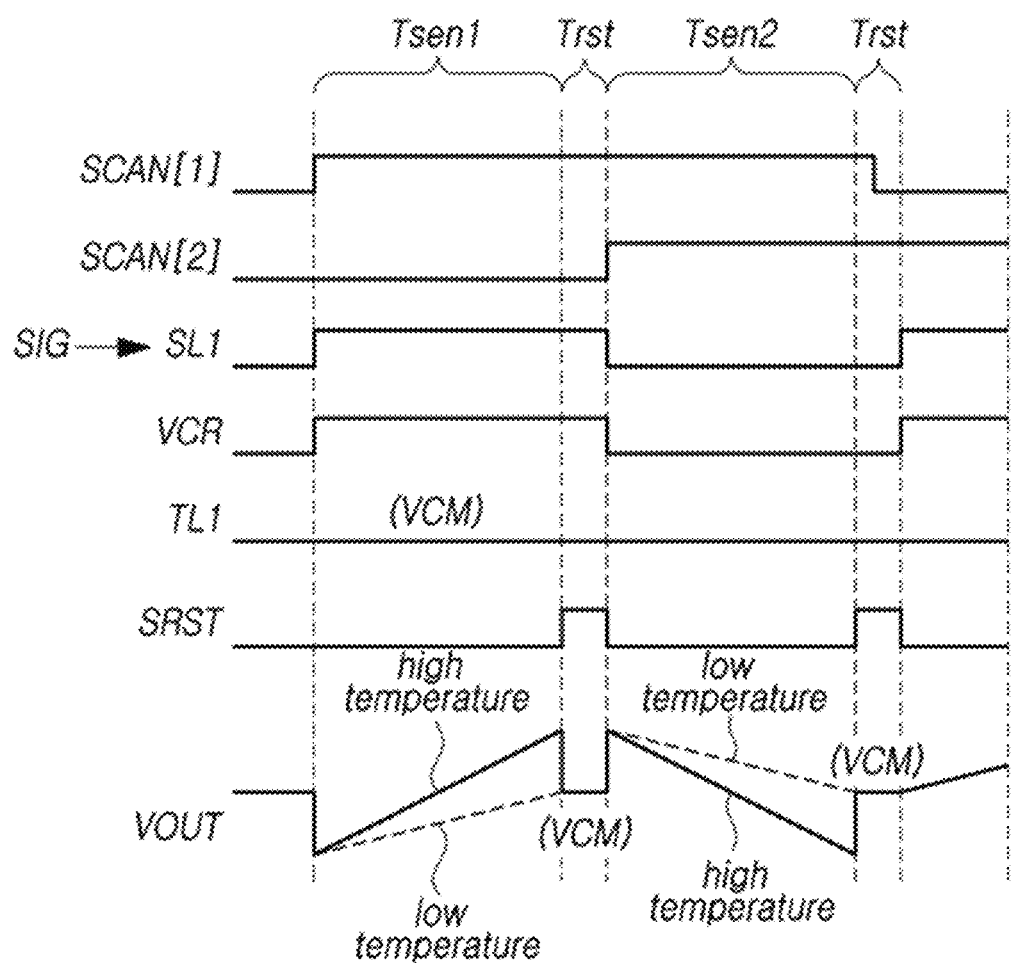
FIG. 19B is a timing diagram when temperature sensing proceeds according to a fourth temperature sensing operation state during a display period in a touch display device according to exemplary embodiments of the disclosure.

FIG. 19A is a timing diagram when temperature sensing proceeds according to a third temperature sensing operation state during a display period DP in a touch display 100 device according to exemplary embodiments of the disclosure. FIG. 19B is a timing diagram when temperature sensing proceeds according to a fourth temperature sensing operation state during a display period DP in a touch display device 100 according to exemplary embodiments of the disclosure.

Referring to FIGS. 19A and 19B, during the display period DP, i.e., during the period when the first sensing transistor ST1 is turned on, the driving signal VCM supplied to the first touch line TL1 may have a predetermined voltage level.

However, during the display period DP, i.e., during the period when the first sensing transistor ST1 is turned on, the test signal SIG supplied to the first sensing line SL1 may be a signal in which the voltage level is changed.

Referring to FIGS. 19A and 19B, the voltage level of the test signal SIG supplied to the first sensing line SL1 may be changed in synchronization with the rising timing of the scanning gate signals SCAN[1] and SCAN[2].

As described above, the temperature sensing operation states when the test signal SIG is an AC signal in which the voltage level is changed is referred to as a third temperature sensing operation state and a fourth temperature sensing operation state.

Referring to FIGS. 19A and 19B, in the third temperature sensing operation state and the fourth temperature sensing operation state, the voltage level of the charge removal control signal VCR input to the charge removal circuit CR in the touch driving circuit 160 may be changed during the display period DP.

Referring to FIGS. 19A and 19B, the voltage level of the charge removal control signal VCR during the first temperature sensing period Tsen1 and the voltage level of the charge removal control signal VCR during the second temperature sensing period Tsen2 may be different from each other. For example, the voltage level of the charge removal control signal VCR during the first temperature sensing period Tsen1 and the subsequent reset period Trst may be a high level. The voltage level of the charge removal control signal VCR during the second temperature sensing period Tsen2 and the subsequent reset period Trst may be a low level.

Referring to FIGS. 19A and 19B, at the start time of the first temperature sensing period Tsen1, the charge at the second input terminal IN2 of the charge amplifier CAMP may be removed by rising of the charge removal control signal VCR. Accordingly, at the start time of the first temperature sensing period Tsen1, the value of the output signal VOUT may rapidly decrease to a reference lower limit value.

Referring to FIGS. 19A and 19B, during the first temperature sensing period Tsen1, the first sensing line SL1 may be in a voltage state higher than the first touch line TL1. Accordingly, a current may flow from the first sensing line SL1 to the first touch line TL1. Accordingly, the value of the output signal VOUT of the charge amplifier CAMP in the touch driving circuit 160 may increase from the reference lower limit value over time (see FIGS. 17A and 17B).

In this case, as the temperature increases, the mobility of the first sensing transistor ST1 in the first touch sensor unit area TSU1 may increase. Accordingly, as the amount of current flowing from the first sensing line SL1 to the first touch line TL1 per unit time increases, the value of the output signal VOUT output from the output terminal OUT of the charge amplifier CAMP in the touch driving circuit 160 may increase more rapidly (see FIGS. 17A and 17B).

Referring to FIGS. 19A and 19B, at the start time of the second temperature sensing period Tsen2, charges may be introduced into the second input terminal IN2 of the charge amplifier CAMP by falling of the charge removal control signal VCR. Accordingly, at the start time of the second temperature sensing period Tsen2, the value of the output signal VOUT may rapidly increase to the reference upper limit value.

Referring to FIGS. 19A and 19B, during the second temperature sensing period Tsen2, the first touch line TL1 may be in a higher voltage state than the first sensing line SL1. Accordingly, a current may flow from the first touch line TL1 to the first sensing line SL1. Accordingly, the value of the output signal VOUT of the charge amplifier CAMP in the touch driving circuit 160 may decrease from the reference upper limit over time (see FIGS. 18A and 18B).

In this case, as the temperature increases, the mobility of the second sensing transistor ST2 in the second touch sensor unit area TSU2 may increase. Accordingly, as the amount of current flowing from the first touch line TL1 to the first sensing line SL1 per unit time increases, the value of the output signal VOUT output from the output terminal OUT of the charge amplifier CAMP in the touch driving circuit 160 may decrease more rapidly (see FIGS. 18A and 18B).

Referring to FIG. 19A, in the third temperature sensing operation state, the temporal length of the period when each of the first scanning gate signal SCAN[1] and the second scanning gate signal SCAN[2] has the turn-on level voltage (e.g., the high level voltage) may correspond to 1 horizontal time.

In the third temperature sensing operation state, the temporal length of the period when the first scanning gate signal SCAN[1] has the turn-on level voltage (e.g., the high level voltage) may correspond to the temporal length of the first temperature sensing period Tsen1 for the first touch sensor unit area TSU1. Similarly, the temporal length of the period when the second scanning gate signal SCAN[2] has a turn-on level voltage (e.g., a high level voltage) may correspond to the temporal length of the second temperature sensing period Tsen2 for the second touch sensor unit area TSU2. As an example, the temporal length of the period when the first scanning gate signal SCAN[1] has the turn-on level voltage (e.g., the high level voltage) may be equal to or longer than, and overlap the entirety the temporal length of the first temperature sensing period Tsen1 for the first touch sensor unit area TSU1, and/or the temporal length of the period when the second scanning gate signal SCAN[2] has a turn-on level voltage (e.g., a high level voltage) may be equal to or longer than, and overlap the entirety of the temporal length of the second temperature sensing period Tsen2 for the second touch sensor unit area TSU2. As an example, the temporal length of the first temperature sensing period Tsen1 for the first touch sensor unit area TSU1 and/or the temporal length of the second temperature sensing period Tsen2 for the second touch sensor unit area TSU2 may be equal to or smaller than 1 horizontal time.

Referring to FIG. 19B, in the fourth temperature sensing operation state, the temporal length of the period when each of the first scanning gate signal SCAN[1] and the second scanning gate signal SCAN[2] has the turn-on level voltage (e.g., the high level voltage) may correspond to 2 horizontal times.

In the fourth temperature sensing operation state, the temporal length of the period when the first scanning gate signal SCAN[1] has the turn-on level voltage (e.g., the high level voltage) may correspond to twice the temporal length of the first temperature sensing period Tsen1 for the first touch sensor unit area TSU1. Similarly, the temporal length of the period when the second scanning gate signal SCAN [2] has a turn-on level voltage (e.g., a high level voltage) may correspond to twice the temporal length of the second temperature sensing period Tsen2 for the second touch sensor unit area TSU2.

Figure 20A:
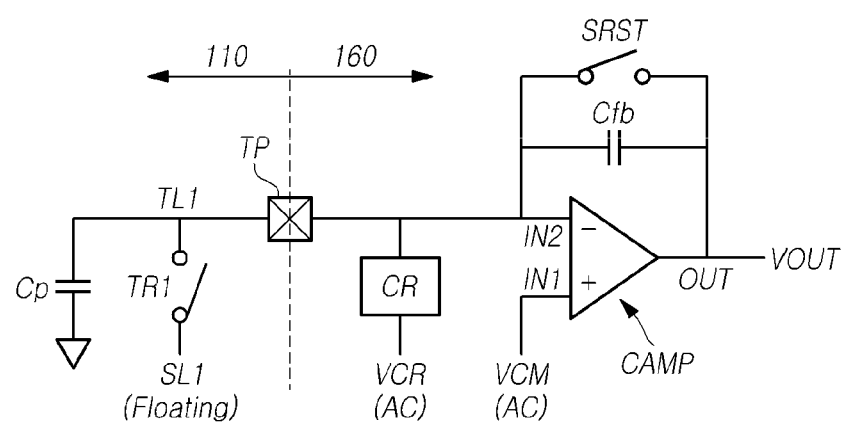
FIG. 20A is a view illustrating a touch driving circuit and a touch sensing operation state during a touch period in a touch display device according to exemplary embodiments of the disclosure.
Figure 20B:
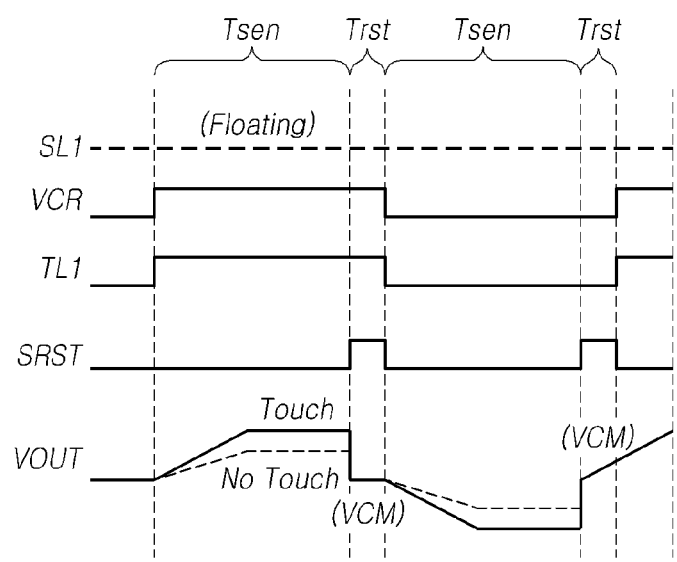
FIG. 20B is a timing diagram during a touch period in a touch display device according to exemplary embodiments of the disclosure.

FIG. 20A is a view illustrating a touch driving circuit 160 and a touch sensing operation state during a touch period TP in a touch display device 100 according to exemplary embodiments of the disclosure. FIG. 20B is a timing diagram during a touch period TP in a touch display device 100 according to exemplary embodiments of the disclosure.

Referring to FIGS. 20A and 20B, the first sensing transistor ST1 may be turned off during the touch period TP, and thus the first touch sensor TS1 and the first sensing line SL1 may be electrically separated from each other. Accordingly, during the touch period TP, the first touch line TL1 connected to the first touch sensor TS1 may be electrically separated from the first sensing line SL1. Accordingly, during the touch period TP, the first sensing line SL1 may be in an electrically floating state.

Referring to FIGS. 20A and 20B, during the touch period TP, the charge removal control signal VCR input to the charge removal circuit CR in the touch driving circuit 160 may be an AC signal whose voltage level is changed.

Referring to FIGS. 20A and 20B, the touch period TP may include a plurality of sensing periods Tsen and a plurality of reset periods Trst.

Referring to FIGS. 20A and 20B, the touch period TP may include a first sensing period Tsen in which the voltage level of the driving signal VCM supplied to the first touch line TL1 is a high level and a second sensing period Tsen in which the voltage level of the driving signal VCM supplied to the first touch line TL1 is a low level.

Referring to FIGS. 20A and 20B, the voltage level of the driving signal VCM supplied to the first touch line TL1 during the first sensing period Tsen and the voltage level of the driving signal VCM supplied to the first touch line TL1 during the second sensing period Tsen may be different from each other. For example, the voltage level of the driving signal VCM during the first sensing period Tsen and the subsequent reset period Trst may be a high level. The voltage level of the driving signal VCM during the second sensing period Tsen and the subsequent reset period Trst may be a low level.

Referring to FIGS. 20A and 20B, during the touch period TP, the voltage level of the charge removal control signal VCR may be changed in synchronization with a change in the voltage level of the driving signal VCM supplied to the first touch line TL1.

In other words, during the touch period TP, when the voltage level of the driving signal VCM supplied to the first touch line TL1 rises, the voltage level of the charge removal control signal VCR may rise. When the voltage level of the driving signal VCM supplied to the first touch line TL1 falls, the voltage level of the charge removal control signal VCR may fall.

Referring to FIGS. 20A and 20B, the reset switch SRST may be turned on during a plurality of reset periods Trst, and may be turned off during a plurality of sensing periods Trst.

Referring to FIGS. 20A and 20B, during the touch period TP, the driving signal VCM input to the first input terminal IN1 of the charge amplifier CAMP in the touch driving circuit 160 may be an AC signal having a variable voltage level. Here, the AC signal-type driving signal VCM may be referred to as a touch driving signal TDS.

Referring to FIGS. 20A and 20B, the AC signal-type driving signal VCM input to the first input terminal IN1 of the charge amplifier CAMP may be output to the first touch line TL1 through the second input terminal IN2. The AC signal-type driving signal VCM output to the first touch line TL1 may be applied to the first touch sensor TS1 through the first touch bridge line TB1.

Referring to FIGS. 20A and 20B, during a plurality of sensing periods Tsen in the touch period TP, the touch driving circuit 160 may sense capacitance.

Referring to FIGS. 20A and 20B, during the first sensing period Tsen in which the voltage level of the driving signal VCM supplied to the first touch line TL1 is the high level, the output signal VOUT of the charge amplifier CAMP of the touch driving circuit 160 may increase for a predetermined time. The output signal VOUT when a touch is present may increase more rapidly than the output signal VOUT when the touch is not present.

During the reset period Trst after the first sensing period Tsen in the touch period TP, the reset switch SRST may be turned on, and the driving signal VCM input to the first input terminal IN1 of the charge amplifier CAMP may be applied to the output terminal OUT of the charge amplifier CAMP. Accordingly, the output signal VOUT of the charge amplifier CAMP may be the driving signal VCM.

Referring to FIGS. 20A and 20B, during the second sensing period Tsen in which the voltage level of the driving signal VCM supplied to the first touch line TL1 is the low level, the output signal VOUT of the charge amplifier CAMP of the touch driving circuit 160 may decrease over time. The output signal VOUT when the touch is present may decrease more rapidly than the output signal VOUT when the touch is not present.

Figure 21A:
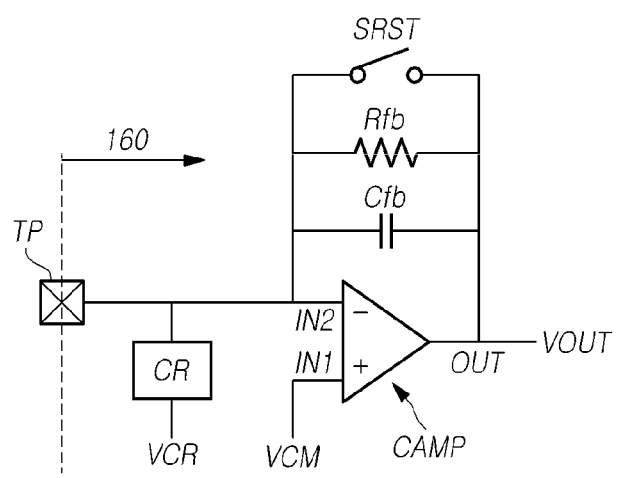
FIG. 21A is a view illustrating another example of a touch driving circuit according to exemplary embodiments of the disclosure.
Figure 21B:
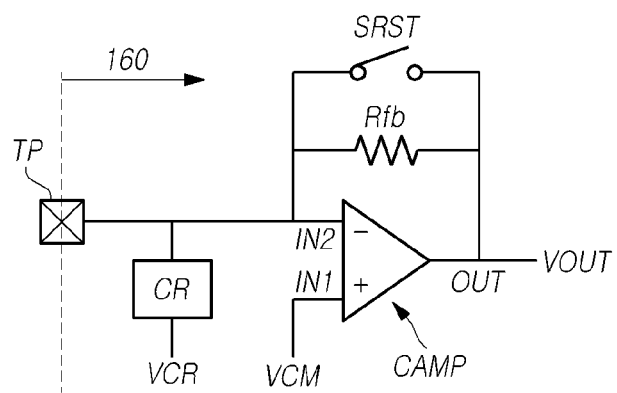
FIG. 21B is a view illustrating another example of a touch driving circuit according to exemplary embodiments of the disclosure.

FIG. 21A is a view illustrating another example of a touch driving circuit 160 according to exemplary embodiments of the disclosure. FIG. 21B is a view illustrating another example of a touch driving circuit 160 according to exemplary embodiments of the disclosure.

FIGS. 21A and 21B are other exemplary embodiments of the touch driving circuit 160 of FIG. 4.

Referring to FIG. 21A, the touch driving circuit 160 may further include a feedback resistor Rfb connected between the second input terminal IN2 and the output terminal OUT of the charge amplifier CAMP. Here, the feedback resistor Rfb may be connected in parallel with the feedback capacitor Cfb between the second input terminal IN2 and the output terminal OUT of the charge amplifier CAMP.

In other words, the reset switch SRST, the feedback capacitor Cfb, and the feedback resistor Rfb may be connected between the second input terminal IN2 and the output terminal OUT of the charge amplifier CAMP.

Referring to FIG. 21B, the touch driving circuit 160 may include a feedback resistor Rfb connected between the second input terminal IN2 and the output terminal OUT of the charge amplifier CAMP. However, the touch driving circuit 160 does not include the feedback capacitor Cfb between the second input terminal IN2 and the output terminal OUT of the charge amplifier CAMP.

In other words, the reset switch SRST and the feedback resistor Rfb may be connected between the second input terminal IN2 and the output terminal OUT of the charge amplifier CAMP.

Figure 22:
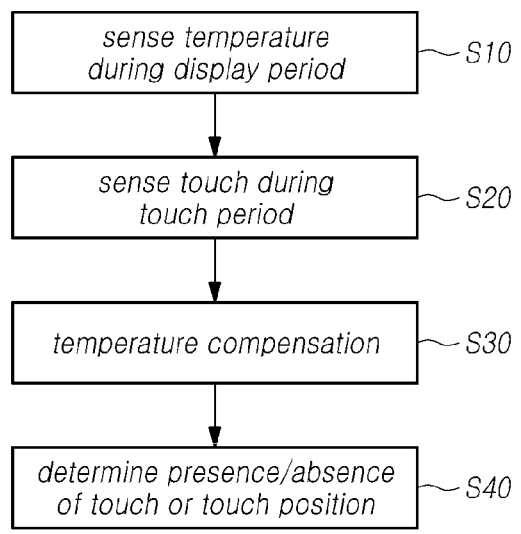
FIG. 22 is a flowchart illustrating a touch sensing method of a touch display device according to exemplary embodiments of the disclosure.

FIG. 22 is a flowchart illustrating a touch sensing method of a touch display device 100 according to exemplary embodiments of the disclosure.

Referring to FIG. 22, a touch sensing method of the touch display device 100 according to exemplary embodiments of the disclosure may include a temperature sensing step S10, a touch sensing step S20, a temperature compensation step S30, and a touch presence or touch position determination step S40.

In the temperature sensing step S10, the current sensing circuit TSC or the touch driving circuit 160 of the touch display device 100 may obtain the temperature sensing value by sensing the temperature of an area of the first touch sensor TS1, or may obtain the current sensing value as the temperature sensing value by sensing the current through the first touch sensor TS1. Here, the current flowing through the first touch sensor TS may vary depending on the temperature.

Here, the mobility of the first sensing transistor ST1 may change according to the temperature change, and accordingly, the amount of current flowing through the first touch sensor TS1 connected to the first sensing transistor ST1 may change according to the temperature change.

In the touch sensing step S20, the touch driving circuit 160 of the touch display device 100 may obtain a first touch sensing value through the first touch sensor TS1 during the touch period TP.

In the temperature compensation step S30, the touch controller 170 of the touch display device 100 may generate the second touch sensing value by changing the first touch sensing value based on the temperature sensing value corresponding to the current sensing value (see FIG. 14).

In the touch presence or touch position determination step S40, the touch controller 170 of the touch display device 100 may determine whether there is a touch or the touch position based on the second touch sensing value.

Here, the second touch sensing value may be a value obtained by removing temperature influencing from the first touch sensing value. Accordingly, determining whether there is a touch and/or a touch position according to the second touch sensing value may be an accurate touch sensing result.

The temperature of the area of the first touch sensor TS1 may be the temperature of the first touch sensor TS1 or the ambient temperature of the first touch sensor TS1.

As the temperature of the area of the first touch sensor TS1 increases, the amount of current flowing per unit time through the first touch sensor TS1 may increase.

The temperature sensing step S10 of obtaining the temperature sensing value may be performed during the display period DP. Accordingly, while the temperature sensing step S10 of obtaining the temperature sensing value is performed, the data voltage for image displaying may be supplied to the subpixel SP adjacent to the first touch sensor TS1.

As the temperature sensing value corresponding to the current sensing value increases, the compensation value COMP increases, and thus the difference between the first touch sensing value TSN and the second touch sensing value COMP_TSEN may increase (see FIG. 14).

In operation S10, when the first current sensing value or the first temperature sensing value corresponding to the first temperature T1 is obtained, the first current sensing value or the first compensation value COMP1 corresponding to the first temperature sensing value may be determined by referring to the lookup table. Accordingly, the second touch sensing value COMP_TSEN may be a value obtained by subtracting the first compensation value COMP1 from the first touch sensing value TSN (COMP_TSEN=TSEN−COMP1). Here, the first compensation value COMP1 may be a value obtained by multiplying the first current sensing value or the first temperature sensing value by a first weight.

In operation S10, when the second current sensing value or the second temperature sensing value corresponding to the second temperature T2 higher than the first temperature T1 is obtained, the second compensation value COMP2 corresponding to the second temperature sensing value or second current sensing value may be determined by referring to the lookup table. Accordingly, the second touch sensing value COMP_TSEN may be a value obtained by subtracting the second compensation value COMP2 from the first touch sensing value TSEN (COMP_TSEN=TSEN−COMP2). Here, the second compensation value COMP2 may be a value obtained by multiplying the second current sensing value or the second temperature sensing value by a second weight. Here, the second weight may be a value larger than the first weight.

In operation S10, when the third current sensing value or the third temperature sensing value corresponding to the third temperature T3 higher than the second temperature T2 is obtained, the third compensation value COMP3 corresponding to the third temperature sensing value or third current sensing value may be determined by referring to the lookup table. Accordingly, the second touch sensing value COMP_TSEN may be a value obtained by subtracting the third compensation value COMP3 from the first touch sensing value TSEN (COMP_TSEN=TSEN−COMP3). Here, the third compensation value COMP3 may be a value obtained by multiplying the third current sensing value or the third temperature sensing value by a third weight. Here, the third weight may be a value larger than the second weight.

Figure 23A:
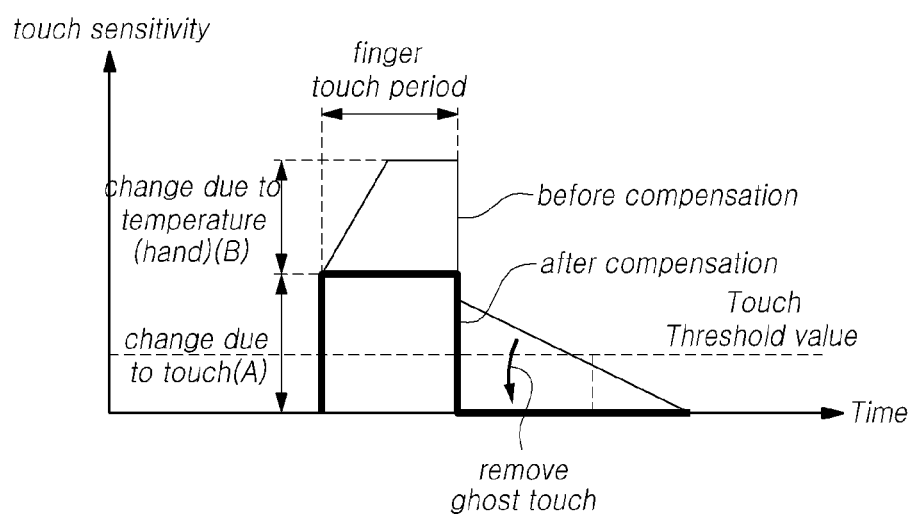
FIG. 23A is a touch sensitivity graph for describing processing for compensating for a change in touch sensitivity according to a temperature change due to a finger touch in a touch display device according to exemplary embodiments of the disclosure.

FIG. 23A is a touch sensitivity graph for describing processing for compensating for a change in touch sensitivity (change in touch sensing value) according to a temperature change, for example, due to a finger touch, in a touch display device 100 according to exemplary embodiments of the disclosure.

Referring to FIG. 23A, when a finger touch occurs, the temperature of the finger may be transferred to the display panel 110, and a positive heat drift phenomenon may occur. The temperature change of the display panel 110 may be caused by the finger touch.

Referring to FIG. 23A, a touch sensing value (touch sensitivity) before compensating for a change in touch sensitivity according to exemplary embodiments of the disclosure is described as follows.

The variation in the touch sensing value due to the temperature change of the display panel 110 according to the finger touch may include a variation A in the touch sensing value due to the finger touch and a variation B in the touch sensing value according to the temperature of the finger.

The variation A in the touch sensing value by the finger touch is a normal part that is essential for touch sensing and may be a part generated by the finger capacitance.

The variation B in the touch sensing value according to the temperature of the finger may be an unwanted part that may cause a decrease in touch sensitivity, and may be a part generated by an increase in parasitic capacitance ($\Delta Cp$) due to a positive heat drift phenomenon during the finger touch period.

After the finger touch disappears, the touch sensing value decreases, but does not immediately fall to the level before the touch occurs, but may rather have a value larger than or equal to the touch threshold for a predetermined time. Here, the touch threshold value may mean a minimum touch sensing value for considering that a touch has occurred.

Even if the finger touch is removed, if a touch sensing value larger than or equal to the touch threshold value is obtained from the touch driving circuit 160 for a predetermined time (ghost touch generation period), the touch controller 170 may erroneously recognize that the touch has occurred. The recognition of a ghost touch may significantly reduce touch sensitivity.

After compensating for the change in touch sensitivity according to exemplary embodiments of the disclosure, a touch sensing value (touch sensitivity) is described as follows.

The touch sensing value TSEN generated by the touch driving circuit 160 according to the touch sensing result may be a value obtained by adding the variation A in the touch sensing value by the touch of the finger and the variation B in the touch sensing value according to the temperature of the finger, and the compensation value COMP calculated through the current sensing may correspond to the variation B in the touch sensing value according to the temperature of the finger.

The compensated touch sensing value COMP_TSEN may be a value calculated by subtracting the compensation value COMP from the touch sensing value TSEN. Accordingly, the compensated touch sensing value COMP_TSEN includes only the variation A in the touch sensing value by the finger touch, but does not include the variation B in the touch sensing value according to the temperature of the finger.

Accordingly, as illustrated in FIG. 23A, after compensation, the presence or absence of a touch and/or the touch position may be determined using the compensated touch sensing value COMP_TSEN from which the variation B in the touch sensing value according to the temperature of the finger has been removed, and thus the ghost touch may be removed.

Figure 23B:
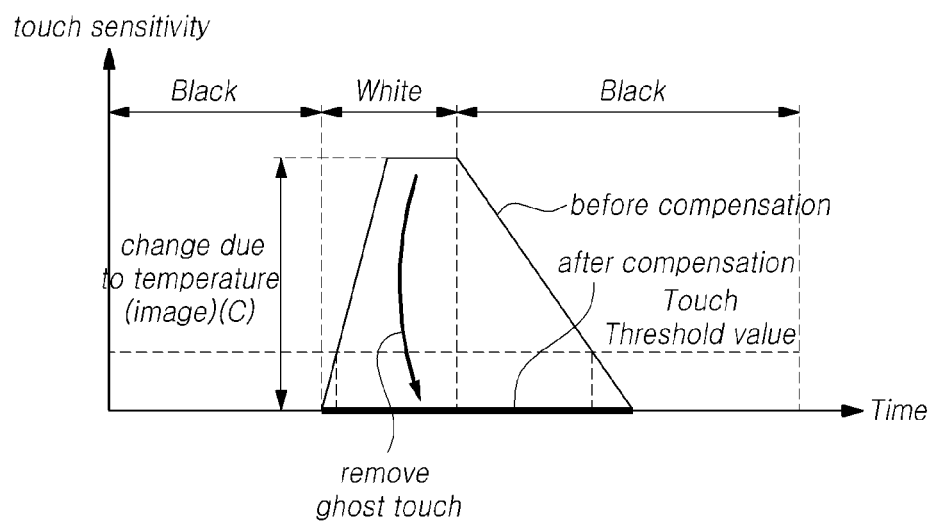
FIG. 23B is a touch sensitivity graph for describing processing for compensating for a change in touch sensitivity according to a temperature change due to an image change in a touch display device according to exemplary embodiments of the disclosure.

FIG. 23B is a touch sensitivity graph for describing processing for compensating for a change in touch sensitivity (change in touch sensing value) according to a temperature change due to an image change in a touch display device 100 according to exemplary embodiments of the disclosure.

Referring to FIG. 23B, touch sensitivity may be reduced not only by finger touch but also by image change.

Referring to FIG. 23B, a touch sensing value (touch sensitivity) before compensating for a change in touch sensitivity according to exemplary embodiments of the disclosure is described as follows.

Referring to FIG. 23B, it may be seen that a phenomenon in which the surface temperature of the display panel 110 is increased by a finger touch occurs similarly even when an image is changed. In other words, when the image is changed, a positive heat drift phenomenon may occur similarly. In other words, although no touch is generated, a change in the touch sensing value may occur due to an image change.

Referring to FIG. 23B, the variation in the touch sensing value due to the image change may be regarded as a variation C in the touch sensing value according to the temperature change of the display panel 110 corresponding to the image change.

For example, when a low grayscale image (e.g., a black image) is changed to a high grayscale image (e.g., a white image), a touch sensing value larger than or equal to a touch threshold value may be obtained from the touch driving circuit 160 even though a touch does not actually occur. When the high grayscale image (e.g., the white image) is changed back to the low grayscale image (e.g., the black image), the touch sensing value may not fall immediately below the touch threshold, but may rather fall below the touch threshold after a little time elapses.

Referring to FIG. 23B, even if a touch does not actually occur, when a touch sensing value larger than or equal to a touch threshold value is obtained from the touch driving circuit 160 according to an image change, the touch controller 170 may recognize that a touch occurs during a period (a period when a ghost touch occurs) in which the touch sensing value is larger than or equal to the touch threshold value. The recognition of a ghost touch may significantly reduce touch sensitivity.

After compensating for the change in touch sensitivity according to exemplary embodiments of the disclosure, a touch sensing value (touch sensitivity) is described as follows.

The touch sensing value TSEN generated by the touch driving circuit 160 according to the touch sensing result may be a value corresponding to the variation C in the touch sensing value according to the temperature change corresponding to the image change. The compensation value COMP calculated through current sensing may correspond to the variation C in the touch sensing value according to the temperature change corresponding to the image change.

The compensated touch sensing value COMP_TSEN may be a value calculated by subtracting the compensation value COMP from the touch sensing value TSEN. Accordingly, the compensated touch sensing value COMP_TSEN does not include a value corresponding to the variation C in the touch sensing value according to the temperature change corresponding to the image change.

Accordingly, as illustrated in FIG. 23B, after compensation, the presence or absence of a touch and/or the touch position may be determined using the compensated touch sensing value COMP_TSEN from which the variation C in the touch sensing value according to the temperature change corresponding to the image change has been removed, and thus the ghost touch may be removed.

Figure 24:
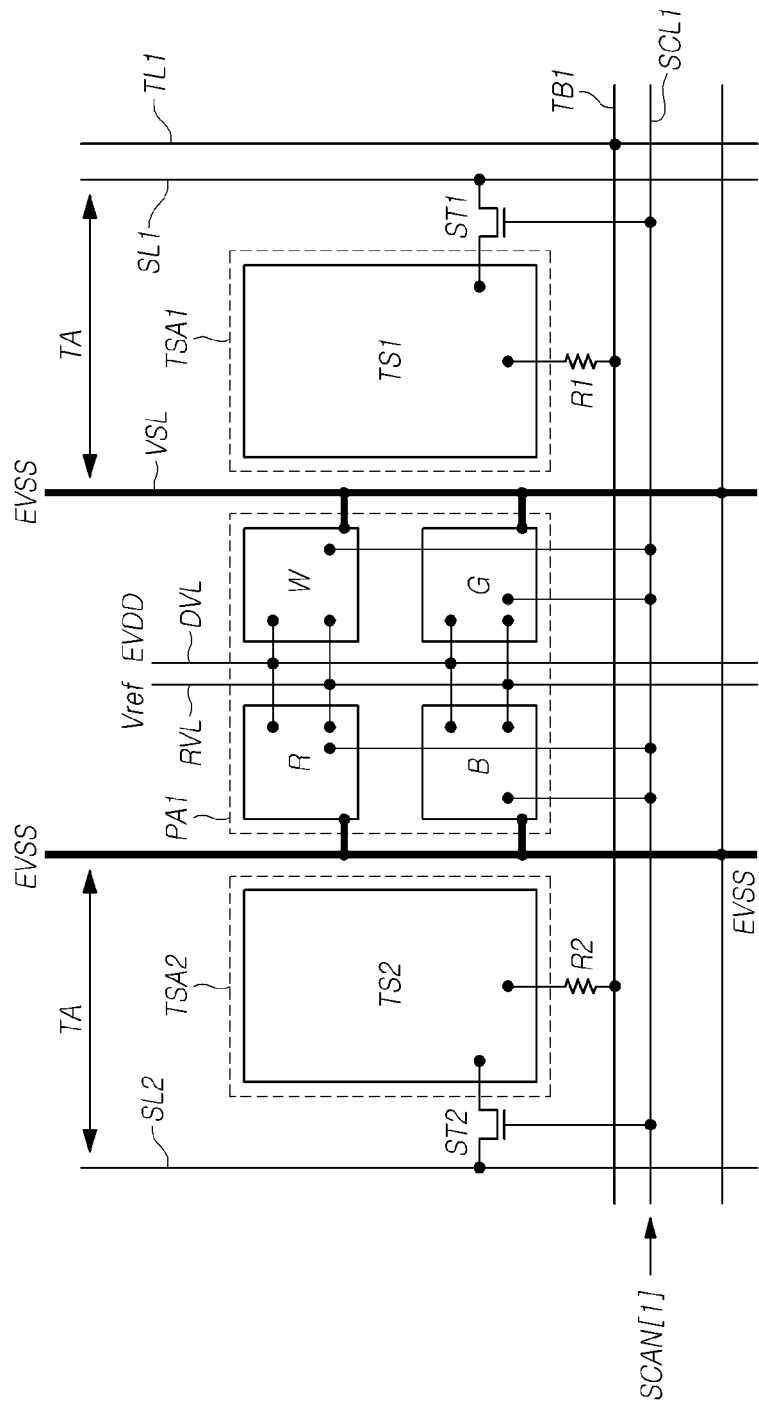
FIG. 24 is a plan view illustrating a first touch sensor area, a first pixel area, and a second touch sensor area when a touch display device is a transparent display according to exemplary embodiments of the disclosure.

FIG. 24 is a plan view illustrating a first touch sensor area TSA1, a first pixel area PA1, and a second touch sensor area when a touch display device 100 is a transparent display according to exemplary embodiments of the disclosure.

Referring to FIG. 24, the display panel 110 may include a first pixel area PA1, a first touch sensor area TSA1 on one side of the first pixel area PA1, and a second touch sensor area TSA1 on the other side of the first pixel area PA1. As an example, the first pixel area PA1 may be disposed between the first touch sensor area TSA1 and the second touch sensor area TSA1.

Referring to FIG. 24, the first touch sensor TS1 may be disposed in the first touch sensor area TSA1, and the second touch sensor TS2 may be disposed in the second touch sensor area TSA1.

Referring to FIG. 24, the display panel 110 may further include a first touch bridge line TB1 for connection between the first touch sensor TS1 and the second touch sensor TS2.

Referring to FIG. 24, the display panel 110 may further include a first sensing line SL1 disposed adjacent to the first touch sensor TS1 and a second sensing line SL2 disposed adjacent to the second touch sensor TS2.

Referring to FIG. 24, the display panel 110 may further include a first sensing transistor ST1 for controlling the connection between the first touch sensor TS1 and the first sensing line SL1, and a second sensing transistor ST2 for controlling the connection between the second touch sensor TS2 and the second sensing line SL2.

Referring to FIG. 24, the first touch sensor area TSA1 in which the first touch sensor TS1 is disposed and the second touch sensor area TSA2 in which the second touch sensor TS2 is disposed may be included in the transmissive area TA. Here, the transmissive area TA may refer to an area through which external light is transmitted and the rear background may be viewed from the front surface, and is also referred to as a transparent area. Embodiments are not limited thereto. As an example, the first touch sensor area TSA1 and the second touch sensor area TSA2 may be included in the non-transmissive area.

The non-transmissive area is an area through which light is not transmitted, and may include an area through which light is not transmitted in the first pixel area PA1 or the first pixel area PA1, and may further include an outer partial area of the first pixel area PA1. The area other than the non-transmissive area may be regarded as the transmissive area TA.

Figure 25:
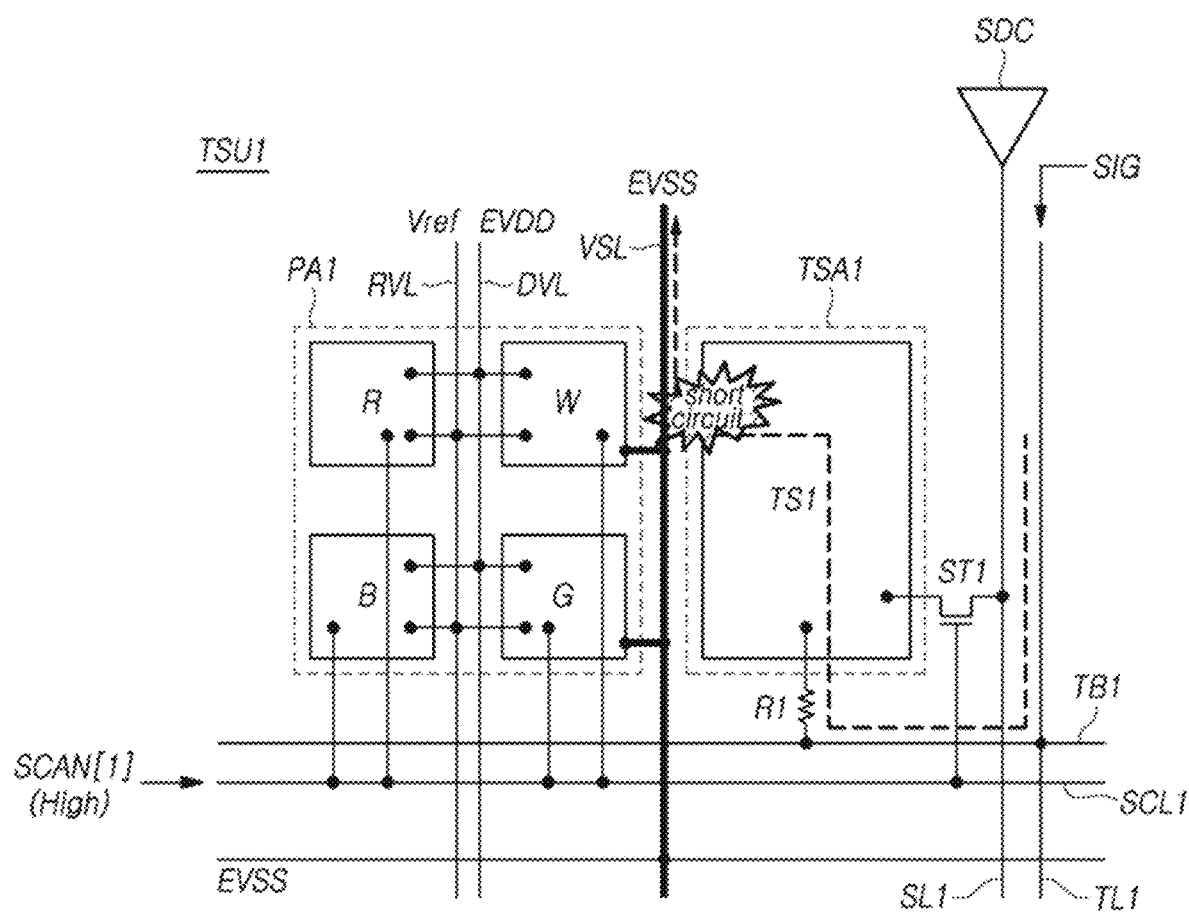
FIG. 25 is a view illustrating a configuration of a touch sensor short-circuit test of a touch display device according to exemplary embodiments of the disclosure.

FIG. 25 is a view illustrating a configuration of a touch sensor short-circuit test of a touch display device 100 according to exemplary embodiments of the disclosure.

Referring to FIG. 25, the temperature sensing components, e.g., TS1, TB1, TL1, SL1, ST1, R1, SCL1, and the like according to exemplary embodiments of the disclosure may be utilized as short-circuit test components for testing a short-circuit between the first touch sensor TS1 and the first display driving line DDL. Here, e.g., the first display driving line DDL may be a second driving power line VSL that transmits the second driving power EVSS to the second electrode E2 of the light emitting element ED. Hereinafter, for convenience of description, a short-circuit test between the first touch sensor TS1 and the second driving power line VSL is exemplified.

Referring to FIG. 25, in the short-circuit test period, the first scanning gate signal SCAN[1] having the turn-on level voltage (e.g., the high level voltage High) may be supplied to the first scanning gate line SCL1. Accordingly, the first sensing transistor ST1 may be turned on, and the first touch sensor TS1 and the first sensing line SL1 may be electrically connected to each other.

Referring to FIG. 25, in the short-circuit test period, the second driving power EVSS may be applied to the second driving power line VSS, and the test signal SIG may be applied to the first touch line TL1. The test signal SIG for short-circuit test may have a constant third voltage value or a voltage level may be varied. Here, the third voltage value may be a voltage value different from the second driving power source EVSS. For example, the third voltage value may be a voltage value significantly higher than the second driving power source EVSS.

Referring to FIG. 25, a short-circuit detection circuit SDC may be connected to the first sensing line SL1. The short-circuit detection circuit SDC may be the same as the current sensing circuit TSC.

Referring to FIG. 25, when a short circuit between the first touch sensor TS1 and the second driving power line VSL does not occur, and when a short-circuit test is performed, the short circuit detection circuit SDC may detect a test signal SIG or a signal corresponding thereto. For example, the short-circuit detection circuit SDC may detect a voltage value corresponding to the third voltage value of the test signal SIG.

Referring to FIG. 25, when a short circuit occurs between the first touch sensor TS1 and the second driving power line VSL, and when a short-circuit test is performed, the short circuit detection circuit SDC may detect a voltage completely different from the test signal SIG or its corresponding signal.

The second driving power EVSS of the second driving power line VSL may be transferred to the first touch sensor TS1, and accordingly, the short-circuit detection circuit SDC may detect a voltage value much lower than the third voltage value of the test signal SIG, so that the short-circuit detection circuit SDC may determine that the short circuit between the first touch sensor TS1 and the second driving power line VSL has occurred, and may output the determination result information to a control device. Here, the control device may include a display controller 140 and/or a touch controller 170, or another device communicating with the display controller 140 and/or the touch controller 170, without being limited thereto.

The control device may control to display an image corresponding to the determination result information according to the determination result information. Here, the displayed image may include problem information or a problem code, and may include a guide phrase leading to an application for product repair.

Further, the control device may transmit the problem information or the problem code to a service center computer of the corresponding product according to the determination result information to perform product repair request processing. In this case, the control device may further transmit product information (e.g., a product model name, etc.), purchase information, or user information to the service center computer.

According to exemplary embodiments of the disclosure described above, there may be provided a touch display device 100 and a touch sensing method capable of removing a ghost touch.

According to exemplary embodiments of the disclosure, there may be provided a touch display device 100 and a touch sensing method for preventing a ghost touch from being recognized after a finger touch occurs.

According to exemplary embodiments of the disclosure, there may be provided a touch display device 100 and a touch sensing method for preventing a ghost touch from being recognized when an image is changed.

According to exemplary embodiments of the disclosure, there may be provided a touch display device 100 and a touch sensing method having a temperature sensor structure coupled to a touch sensor structure.

According to exemplary embodiments of the disclosure, there may be provided a touch display device and a touch sensing method capable of compensating for a touch sensing value by sensing a current reflecting temperature.

According to exemplary embodiments of the disclosure, there may be provided a transparent display capable of touch sensing.

According to exemplary embodiments of the disclosure, as the touch sensor is embedded in the display panel, and a temperature sensor structure is designed using the touch sensor structure embedded in the display panel, it is possible to reduce the weight of the touch display device as compared with when a touch panel is provided outside the display panel or when a temperature sensor is separately provided.

According to exemplary embodiments of the disclosure, as the touch sensor is embedded in the display panel, and a temperature sensor structure is designed using the touch sensor structure embedded in the display panel, it is possible to simplify or omit several processes to help process optimization.

According to exemplary embodiments of the disclosure, as temperature sensing is possible during display driving, low-power and high-efficiency driving is possible.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A touch display device, comprising:
   a first pixel area;
   a first touch sensor area positioned on one side of the first pixel area;
   a first subpixel in the first pixel area, the first subpixel including a light emitting element and a scanning transistor;
   a first display driving line connected to the first subpixel;
   a first touch sensor in the first touch sensor area;
   a first sensing line adjacent to the first touch sensor;
   a first touch line electrically connected to the first touch sensor; and
   a first sensing transistor configured to control an electrical connection between the first sensing line and the first touch sensor.

2. The touch display device of claim 1, further comprising:
   a first scanning gate line simultaneously supplying a first scanning gate signal to gate electrodes of the scanning transistor and the first sensing transistor.

3. The touch display device of claim 2, wherein the scanning transistor and the first sensing transistor have a same type, and are simultaneously controlled to be turned on or off by the first scanning gate signal.

4. The touch display device of claim 1, wherein the first touch sensor area is included in a transmissive area through which external light may be transmitted.

5. The touch display device of claim 1, wherein the first touch sensor includes a transparent electrode material.

6. The touch display device of claim 1, further comprising:
   a sensing resistor connected between the first touch line and the first touch sensor.

7. The touch display device of claim 1, further comprising: an organic film included in the light emitting element.

8. The touch display device of claim 1, wherein during a display period when a data voltage for displaying an image is supplied to the first subpixel, the first sensing transistor is turned on, and during a touch period that is different from the display period, the first sensing transistor is turned off.

9. The touch display device of claim 8, wherein during the display period, the first touch sensor and the first sensing line are electrically connected, a test signal is supplied to the first touch line, and a current flows through the first sensing line.

10. The touch display device of claim 9, wherein during the display period, as a temperature of the first touch sensor area increases, an amount of the current flowing through the first sensing line per unit time increases, and during the display period, as the temperature of the first touch sensor area decreases, the amount of the current flowing through the first sensing line per unit time decreases.

11. The touch display device of claim 10, wherein during the display period, when a touch occurs in or around the first touch sensor area, or when an image displayed in relation to the first pixel area changes to a higher grayscale, the amount of the current flowing through the first sensing line per unit time increases.

12. The touch display device of claim 10, wherein during the display period, as the amount of the current flowing through the first sensing line per unit time changes, a touch sensing value obtained during the touch period after the display period is changed.

13. The touch display device of claim 8, wherein during the touch period, the first touch sensor and the first sensing line are electrically separated, a touch driving signal whose voltage level is varied is supplied to the first touch line, and a current does not flow through the first sensing line.

14. The touch display device of claim 8, wherein during the display period, the first touch sensor and the first sensing line are electrically connected, a test signal is supplied to the first sensing line, and a current flows through the first touch line.

15. The touch display device of claim 14, wherein during the display period, the test signal supplied to the first sensing line is a direct current (DC) voltage signal having a constant first voltage value, and
   wherein during the display period, a driving signal corresponding to a DC voltage signal having a second voltage value that is less than or greater than the constant first voltage value is supplied to the first touch line.

16. The touch display device of claim 14, wherein during the display period, as a temperature of the first touch sensor area increases, an amount of the current flowing through the first touch line increases and as the temperature of the first touch sensor area decreases, the amount of the current flowing through the first touch line decreases.

17. The touch display device of claim 16, wherein during the display period, when a touch occurs in or around the first touch sensor area, or when an image displayed in relation to the first pixel area changes to a higher grayscale, the amount of the current flowing through the first touch line increases.

18. The touch display device of claim 1, wherein at least two sub-pixels are disposed in the first touch sensor area.

19. The touch display device of claim 1, further comprising:
   a first scanning gate line supplying a first scanning gate signal to a gate electrode of the scanning transistor,
   wherein the first sensing line is in parallel with the first touch line and the first display driving line, and intersects with the first scanning gate line.

20. The touch display device of claim 19, wherein the first sensing line is commonly connected to a plurality of first sensing transistors arranged in a column direction along which the first sensing line extends, and the plurality of first sensing transistors respectively correspond to a plurality of first touch sensors arranged in the column direction, and are turned on sequentially.

21. The touch display device of claim 1, wherein the scanning transistor is configured to transfer a data voltage to a gate electrode of a driving transistor for driving the light emitting element.

22. The touch display device of claim 1, wherein the first sensing transistor has a characteristic in which mobility changes according to a temperature change.

23. A touch display device, comprising:
   a first touch sensor in a first touch sensor area;
   a first sensing line adjacent to the first touch sensor;
   a first touch line electrically connected to the first touch sensor; and a first sensing transistor configured to control an electrical connection between the first sensing line and the first touch sensor.

24. The touch display device of claim 23, wherein a test signal is supplied to the first touch line during a period when the first sensing transistor is turned on, and the touch display device further comprises:
   a current sensing circuit configured to sense a current flowing through the first sensing line during the period when the first sensing transistor is turned on.

25. The touch display device of claim 23, wherein a test signal is supplied to the first sensing line during a period when the first sensing transistor is turned on, and the touch display device further comprises:
   a touch driving circuit configured to sense a current flowing through the first touch line during the period when the first sensing transistor is turned on.

* * * * *